United States Patent
Tanaka et al.

(10) Patent No.: US 8,138,058 B2
(45) Date of Patent: Mar. 20, 2012

(54) SUBSTRATE WITH MARKER, MANUFACTURING METHOD THEREOF, LASER IRRADIATION APPARATUS, LASER IRRADIATION METHOD, LIGHT EXPOSURE APPARATUS, AND MANUFACTURING METHOD OF SEMICONDUCTOR DEVICE

(75) Inventors: Koichiro Tanaka, Kanagawa (JP); Takatsugu Omata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 106 days.

(21) Appl. No.: 11/942,133

(22) Filed: Nov. 19, 2007

(65) Prior Publication Data

US 2008/0121819 A1    May 29, 2008

(30) Foreign Application Priority Data

Nov. 24, 2006   (JP) ................... 2006-317496

(51) Int. Cl.
*H01L 21/76* (2006.01)
(52) U.S. Cl. ........ 438/401; 438/462; 438/942; 257/797; 257/E23.179
(58) Field of Classification Search .................. 438/401, 438/462, 942; 257/797, E23.179
See application file for complete search history.

(56) References Cited

U.S. PATENT DOCUMENTS

| | | | |
|---|---|---|---|
| 6,700,096 B2 | 3/2004 | Yamazaki et al. | |
| 6,764,886 B2 | 7/2004 | Yamazaki et al. | |
| 6,962,860 B2 | 11/2005 | Yamazaki et al. | |
| 6,979,605 B2 | 12/2005 | Yamazaki et al. | |
| 7,050,878 B2 | 5/2006 | Yamazaki et al. | |
| 7,133,737 B2 | 11/2006 | Miyanaga et al. | |
| 7,214,574 B2* | 5/2007 | Yamazaki et al. | 438/166 |
| 2002/0149057 A1* | 10/2002 | Kawasaki et al. | 257/350 |
| 2004/0082111 A1* | 4/2004 | Yamauchi | 438/118 |
| 2005/0056844 A1* | 3/2005 | Fukada et al. | 257/66 |
| 2005/0250292 A1* | 11/2005 | Baluswamy et al. | 438/401 |
| 2006/0003478 A1* | 1/2006 | Hongo et al. | 438/29 |
| 2006/0155413 A1 | 7/2006 | Yamazaki et al. | |
| 2006/0252261 A1* | 11/2006 | Tanaka et al. | 438/662 |
| 2007/0008542 A1* | 1/2007 | Takami | 356/446 |
| 2007/0109470 A1 | 5/2007 | Hosoya | |
| 2007/0139660 A1* | 6/2007 | Tanaka et al. | 356/614 |

FOREIGN PATENT DOCUMENTS

| | | |
|---|---|---|
| JP | 2001-148600 | 5/2001 |
| JP | 2002-350800 | 12/2002 |
| JP | 2003-224084 | 8/2003 |

\* cited by examiner

*Primary Examiner* — William D Coleman
*Assistant Examiner* — Su Kim
(74) *Attorney, Agent, or Firm* — Husch Blackwell LLP

(57) ABSTRACT

To provide a laser irradiation apparatus which performs alignment of an irradiated object and emits a laser beam precisely, a laser irradiation method, and a manufacturing method of a TFT with high reliability with the use of a method for precisely targeting a desired irradiation position of the laser beam. A substrate with marker is mounted on a stage formed using a material which transmits infrared light; a marker, which is provided in the substrate with marker mounted on the stage, is detected using a camera capable of sensing infrared light, and a position of the stage is controlled; a laser beam is emitted from a laser oscillator; the laser beam emitted from the laser oscillator is processed into a linear shape by an optical system, and the substrate with marker mounted on the stage is irradiated with the laser beam.

10 Claims, 15 Drawing Sheets

SUBSTRATE WITH MARKER, MANUFACTURING METHOD THEREOF, LASER IRRADIATION APPARATUS, LASER IRRADIATION METHOD, LIGHT EXPOSURE APPARATUS, AND MANUFACTURING METHOD OF SEMICONDUCTOR DEVICE

BACKGROUND OF THE INVENTION

1. Field of the Invention

The present invention relates to a substrate with marker provided with a marker for adjusting an irradiation position of a laser beam, and a manufacturing method of the substrate. Moreover, the present invention relates to an irradiation method of a laser beam using the substrate with marker, a laser irradiation apparatus, and a light exposure apparatus. Further, the present invention relates to a manufacturing method of a semiconductor device with the use of the laser irradiation apparatus or the light exposure apparatus.

2. Description of the Related Art

In recent years, a technique for manufacturing a thin film transistor (hereinafter referred to as a TFT) over a substrate has drastically progressed and development for applying a TFT to an active matrix display device has been advanced. In particular, since a TFT using a polycrystalline semiconductor film has higher electric field effect mobility (also referred to as mobility, simply) than a conventional TFT using a non-single crystal semiconductor film, high speed operation is possible. Therefore, it has been attempted that a pixel, which has been conventionally controlled by a driver circuit provided outside a substrate, is controlled by a driver circuit provided over the same substrate as the pixel.

A substrate used for a semiconductor device is expected to be a glass substrate rather than a single crystalline semiconductor substrate in terms of cost. However, a glass substrate is inferior in heat resistance and easy to be deformed due to heat. Therefore, when a TFT using a polycrystalline semiconductor film is formed over a glass substrate, laser annealing is often employed for crystallizing a semiconductor film in order to prevent the glass substrate from being deformed due to heat.

Compared with another annealing method which uses radiation heat or conduction heat, the laser annealing has advantages such that the process time can be shortened drastically and that a semiconductor substrate or a semiconductor film can be heated selectively or locally so that thermal damage is hardly given to the substrate.

In this specification, the laser annealing means a technique of crystallizing a damaged layer or an amorphous layer formed in a semiconductor substrate or a semiconductor film, a technique of crystallizing an amorphous semiconductor film formed over a substrate. Moreover, the laser annealing includes a technique applied to planarize or modify a surface of a semiconductor substrate or a semiconductor film.

Laser oscillators used for the laser annealing can be broadly classified into pulsed laser oscillators and continuous wave (CW) laser oscillators according to the oscillation method. In recent years, it has been known that the size of a crystal grain formed in a semiconductor film becomes larger when using a CW laser oscillator such as an Ar laser or a $YVO_4$ laser than when using a pulsed laser oscillator such as an excimer laser at the crystallization of the semiconductor film. When the size of the crystal grain in the semiconductor film becomes larger, the number of grain boundaries in a channel forming region of a TFT formed using this semiconductor film decreases; therefore, the mobility increases. Accordingly, thus manufactured TFT can be used to develop a more sophisticated device. This is the reason why the CW laser oscillator attracts attention.

In general, a beam spot of a laser beam (also referred to as laser light) used for laser annealing of a semiconductor film has a linear shape, and laser annealing is performed by scanning the beam spot of the laser beam processed into a linear shape over a semiconductor film. When the beam spot of the laser beam is processed into a linear shape, the semiconductor film can be crystallized efficiently.

In the case where a silicon (Si) film with thicknesses of several tens to several hundreds of nm which is generally used for a semiconductor device is crystallized with the use of a YAG laser or a $YVO_4$ laser, a laser beam of a second harmonic with shorter wavelength than the fundamental wave is used in terms of an absorption coefficient. This is because the semiconductor film can be crystallized more efficiently, as an absorption coefficient of laser light with respect to the semiconductor film is larger.

In general, in a step of performing laser annealing using a continuous wave laser oscillator with a harmonic, a semiconductor film is annealed nonuniformly. This is because laser light emitted from a continuous wave laser oscillator generally has Gaussian energy distribution.

In opposite ends of a linear beam in a longitudinal direction, a region with extremely small crystal grains and poor crystallinity compared with that in the center thereof is formed. This is because, since the opposite ends of the linear beam have low energy, there is a tendency that a region which is not melted partially remains, such crystal grains with a large grain diameter that are formed in the vicinity of the center of the linear beam cannot be obtained, and crystal grains with a comparatively small grain diameter (microcrystals) are formed in the region. Unevenness is noticeable in a surface of a region in which microcrystals are formed, which is unsuitable for manufacturing a semiconductor element. In the case where a semiconductor element is formed over the region, it causes variation in electric characteristic or operation failure. That is, in a step of performing laser annealing, it is necessary to decide in advance in which area over the substrate a semiconductor element is formed and to perform laser annealing by targeting a region in which a semiconductor element is formed.

In general, the size of a semiconductor element is the square of several μm to several hundreds of μm, which is extremely minute. Further, a length of the beam spot of the linear laser beam is as short as several hundreds of μms to several mm. Therefore, it is necessary to decide a position of laser irradiation extremely precisely when crystallization is performed by targeting a region in which a semiconductor element is formed. Accordingly, in performing laser irradiation, a marker is formed in a desired position over a substrate and precise alignment is performed using the marker as a reference point; thus, laser irradiation is performed (for example, Patent Document 1: Japanese Published Patent Application No. 2003-224084). It is to be noted that a method for recognition by processing an image captured by a CCD camera is frequently used for precise alignment.

In manufacturing a semiconductor element, a method of precise alignment using a marker as described above is generally used in, for example, a light exposure step of a photolithography method or a laser direct writing step used for formation of a laser semiconductor element, division, opening, and the like, besides a laser annealing step.

SUMMARY OF THE INVENTION

The marker used for alignment is generally formed using a photolithography step with respect to part of the semiconductor film formed over a substrate surface. Thus, since a semiconductor film does not exist in an area where the marker is formed, a semiconductor element cannot be formed therein. Accordingly, a problem occurs in that designing of a circuit is limited. Further, in a laser annealing step, when metal film is used as a base film of the semiconductor film, for example, the metal film is exposed in a marker portion. Therefore, laser irradiation to the portion causes peeling and scattering of the metal film used as the base film, which leads to fear of contamination of the substrate.

In view of the foregoing problem, it is an object of the present invention to provide a laser irradiation apparatus which emits a laser beam precisely and a laser irradiation method. Moreover, it is another object of the present invention to provide a manufacturing method of a TFT with high reliability with the use of a method for precisely targeting a desired irradiation position of the laser beam.

In the present invention, a marker for alignment is formed on a back surface of a substrate to perform alignment of the substrate using a camera which senses infrared light for detecting the marker.

A substrate with a marker according to the present invention includes a marker formation film provided with a plurality of openings each serving as the marker, over one surface of a substrate which transmits infrared light, where the plurality of markers is detected by infrared light.

A marker of the substrate with the marker according to the present invention is formed using a film which includes at least one kind of aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), titanium (Ti), and rhodium (Rh).

A laser irradiation apparatus according to the present invention includes a laser oscillator which emits a laser beam; a stage formed using a material, which transmits infrared light, on which a substrate with a marker is mounted; an optical system by which a laser beam emitted from the laser oscillator is processed into a linear shape and the substrate over the stage is irradiated with the laser beam; and a camera, which senses infrared light, for detecting the marker of the substrate with the marker mounted on the stage.

A laser irradiation apparatus according to the present invention includes a laser oscillator which emits a laser beam; a stage having a suction hole by which a substrate with a marker is fixed, and an opening provided in a region overlapping with the marker; an optical system by which a laser beam emitted from the laser oscillator is processed into a linear shape and the substrate on the stage is irradiated with the laser beam; and a camera, which senses infrared light, for detecting the marker of the substrate with the marker mounted on the stage.

The laser irradiation apparatus according to the present invention includes a shutter which is disposed on a light path of the laser beam and is opened at laser beam irradiation.

A light exposure apparatus according to the present invention includes a light source which emits a light beam; a stage formed using a material, which transmits infrared light, on which a substrate with a marker is mounted; an optical system which delivers the light beam emitted from the light source to the substrate and the substrate on the stage is irradiated with the light beam; and a camera, which senses infrared light, for detecting the marker of the substrate with the marker mounted on the stage.

Another light exposure apparatus according to the present invention includes a light source which emits a light beam; a stage having a suction hole by which a substrate with a marker is fixed, and an opening provided in a region overlapping with the marker; an optical system which delivers the light beam emitted from the light source to the substrate and the substrate on the stage is irradiated with the light beam; and a camera, which senses infrared light, for detecting a marker of the substrate with marker mounted on the stage.

Another light exposure apparatus according to the present invention includes a shutter which controls irradiation with the light beam.

A manufacturing method of a semiconductor device according to the present invention includes the steps of mounting a substrate with a marker on a stage formed using a material which transmits infrared light; detecting the marker with the use of a camera which senses infrared light, and controlling a position of the stage; emitting a laser beam from a laser oscillator; processing the laser beam emitted from the laser oscillator into a linear shape by an optical system, and irradiating the substrate with the marker mounted on the stage with the laser beam; and crystallizing a semiconductor film formed for the substrate with the marker.

Another manufacturing method of a semiconductor device according to the present invention includes the steps of mounting a substrate with a marker on a stage including a suction hole by which the substrate with the marker is fixed, and an opening provided in a region overlapping with the marker; detecting the marker with the use of a camera which senses infrared light, and controlling a position of the stage; emitting a laser beam from a laser oscillator; processing the laser beam emitted from the laser oscillator into a linear shape by an optical system, and irradiating the substrate with the marker mounted on the stage with the laser beam; and crystallizing a semiconductor film provided for the substrate with the marker.

The substrate with a marker of the present invention includes the marker for alignment, which can be detected by infrared light, on one surface of or inside the substrate transmitting infrared light. Accordingly, it is not necessary to provide the marker in the semiconductor film provided over the substrate. Further, in a laser irradiation method or a light exposure apparatus of the present invention, the substrate is mounted on the stage, the marker is detected using a camera which senses infrared light, and alignment of the substrate is performed. Thus, alignment can be performed precisely without providing the marker in the semiconductor film. Further, it is not necessary to design a circuit so as to avoid a region for formation of the marker as in a conventional manner. Therefore, flexibility in designing the circuit can be improved. Hereinafter, in this specification, one surface over which the semiconductor film is formed is referred to as a front surface of the substrate, and the other surface opposed to the semiconductor film is referred to as a back surface of the substrate.

The present invention is applicable to a laser direct writing step and the like as well as a laser annealing step and a light exposure step, and a similar effect can be obtained.

DETAILED DESCRIPTION OF THE INVENTION

Figure 1A:
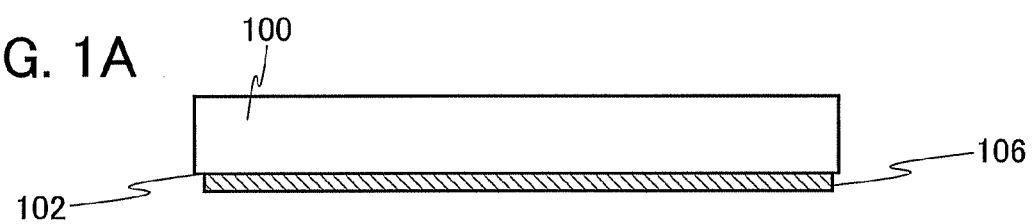
FIGS. 1A to 1E are views showing an outline of a manufacturing process of a substrate with marker of the present invention.

Embodiment modes of the present invention will be explained below with reference to the accompanied drawings. However, the present invention is not limited to explanation to be given below, and it is to be easily understood that various changes and modifications in modes and details thereof will be apparent to those skilled in the art without departing from the purpose and the scope of the present invention. Therefore, the present invention should not be interpreted as being limited to the description of the embodiment modes to be given below. It is to be noted that, in a structure of the present invention which will be explained below, the same portions may be denoted by the same reference numerals through different drawings.

In this specification, the linear beam indicates a laser beam having a linear shape on an irradiated surface. It is to be noted that the term "linear" used herein does not mean a line in a strict sense but means a rectangle having a high aspect ratio (for example, aspect ratio of 10 or more (preferably 100 or more)). The linear shape is adopted because energy density required for sufficient annealing to an irradiated object can be secured. Therefore, as long as sufficient annealing can be conducted to the irradiated object, the laser beam may be shaped into a rectangular or elliptical shape.

Embodiment Mode 1

In this embodiment mode, a substrate with marker according to the present invention is described with reference to FIGS. 1A to 1E.

First, a structure of a substrate with marker, which is used for alignment, according to the present invention is described. As shown in FIG. 1C, the substrate with marker of this embodiment mode includes a marker formation film 106, which is formed on a back surface of a substrate 100 transmitting infrared light and which does not transmit infrared light; a silicon nitride oxide film 103 and a silicon oxynitride film 104 which are formed over the substrate 100 and which serve as a base film; and a semiconductor film 105 formed over the base film. In this embodiment mode, the marker formation film 106 has markers 120 formed of an opening. Further, a structure may be used, in which a separation layer is provided over a front surface of the substrate 100 and separated from the substrate 100 after an element is formed. The silicon nitride oxide film 103 and the silicon oxynitride film 104 are not necessary to be provided.

The markers 120 can be detected in the following manner: the front surface of the substrate with marker shown in FIG. 1C is irradiated with light including infrared light, and infrared light reflected by the marker formation film 106 is sensed using a camera or the like which senses infrared light. In this embodiment mode, the substrate 100, the silicon nitride oxide film 103, the silicon oxynitride film 104, and the semiconductor film 105 transmit infrared light. Therefore, when the front surface of the substrate is irradiated with light including infrared light, infrared light is reflected by the marker formation film and emitted from the front surface of the substrate. However, since the markers 120 are formed of the opening of the marker formation film, a reflecting property of a region in which the markers 120 are formed is different from that of other regions. Accordingly, the markers 120 can be detected by sensing reflected infrared light. Thus, the markers can be detected even when the markers are not provided in the semiconductor film.

Next, a manufacturing method of a substrate with marker, which is used for alignment, according to the present invention is described. First, as shown in FIG. 1A, the marker formation film 106 is formed on a back surface 102 of the substrate 100. As a method for forming the marker formation film 106, a CVD method typified by a plasma CVD method or a low-pressure CVD method, a sputtering method, or the like may be used. The substrate 100 is not particularly limited as long as the substrate 100 transmits infrared light with a wavelength of 800 to 1500 nm. For example, a glass substrate made of barium borosilicate glass or aluminoborosilicate glass, a quartz substrate, a ceramics substrate, or the like can be used. A substrate made of a synthetic resin having flexibility such as plastic generally tends to have heat resistance temperature lower than those of the above substrates. However, such a substrate can be used if it can withstand treatment temperature in a manufacturing step. That is, a plastic substrate having heat resistance can also be used as the substrate 100. As for the marker formation film 106, any kind of a film can be used as long as infrared light with a wavelength of approximately 800 to 1500 nm is not transmitted. For example, a material including any one kind of metal of aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), titanium (Ti), and rhodium (Rh) can be used. A metal film made of any of these metals or a film made of an alloy including these metals is preferable.

Figure 1B:
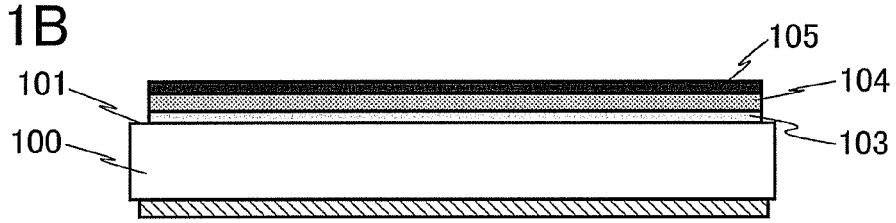
Figure 1C:
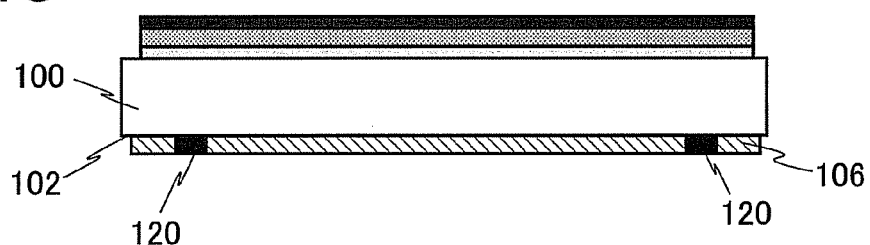

Subsequently, as shown in FIG. 1B, the base film to be a base of the semiconductor film is formed over a front surface 101 of the substrate 100. As the base film, a single layer structure using any one of a silicon oxide film, a silicon nitride film, a silicon oxynitride film, and a silicon nitride oxide film may be used, or a stacked structure in which these are appropriately stacked may be used. In the case where it is not necessary to concern about contamination from the substrate 100 such as the case of using a quartz substrate, the base film may not be formed. In this specification, it is to be noted that silicon oxynitride refers to a substance of which composition ratio of oxygen is higher than that of nitrogen and can also be referred to silicon oxide including nitrogen. Further, in this specification, it is to be noted that silicon nitride oxide refers to a substance of which composition ratio of nitrogen is higher than that of oxygen and can also be referred to as silicon nitride including oxygen. In this embodiment mode, the base film has a structure in which the silicon nitride oxide film 103 and the silicon oxynitride film 104 are sequentially stacked to have a thickness of approximately several tens to several hundreds of nm.

Further, over the silicon nitride oxide film 103 and the silicon oxynitride film 104 as the base film, the semiconductor film 105 is formed to similarly have a thickness of several tens to several hundreds of nm. As the semiconductor film 105, an amorphous semiconductor film may be used, and alternatively, a microcrystalline semiconductor film or a crystalline semiconductor film may be formed. A material for the semiconductor film is not limited, but preferably, silicon or silicon germanium may be used. In this embodiment mode, an amorphous silicon film is formed as the semiconductor film 105. As a method for forming the base film and the semiconductor film 105, in a similar manner to the marker formation film 106, a method such as CVD or sputtering may be used.

When an interface between the base film and the semiconductor film 105 is prevented from being exposed to the atmospheric air when the base film and the semiconductor film 105 are formed, contamination of the interface can be prevented, and variation in characteristics of TFTs to be manufactured can be reduced.

Figure 1D:
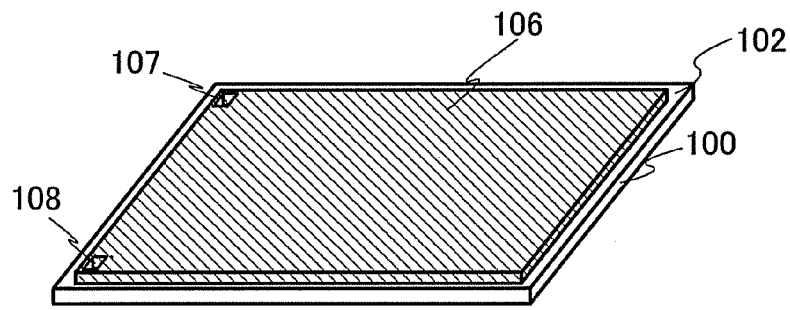
Figure 1E:
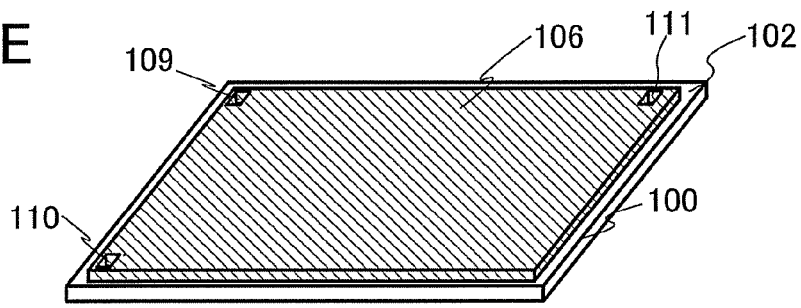

Next, the markers 120 are formed in the marker formation film 106 by a photolithography method (FIG. 1C). FIGS. 1D and 1E show the substrate with marker of this embodiment mode seen from the back surface (that is, the side on which the marker formation film 106 is formed). FIG. 1D shows a substrate with marker used in a laser annealing step, and as a marker used for alignment, markers 107 and 108 are formed. FIG. 1E shows a substrate with marker used in a light exposure step, and as a marker used for alignment, markers 109 to 111 are formed. Any of the markers are desirably formed in a position near the corner of the substrate as shown in FIGS. 1D and 1E. It is to be noted that it is preferable to have a line segment connecting the markers 107 and 108 used in the laser annealing step approximately parallel to a scanning direction of the substrate in the laser annealing step. In general, as the shape of a marker, basic shapes such as a circle or a polygon are frequently used. This is because image recognition using a camera can be accurately performed when a side (an edge) of the marker is clear. This embodiment mode shows an example of manufacturing two or three markers; however, embodiment modes of the present invention are not limited thereto. The markers used for alignment in the laser annealing step are used in order that a line segment connecting a plurality of markers and a moving direction of an X-axis stage are made parallel to each other. Therefore, the number of markers used in the laser annealing step may be at least two, and there may be two or more markers without any problem. The markers used for alignment in the light exposure step are used for precise alignment of an X-axis direction and a Y-axis direction by fixing coordinates of the marker on the X-axis and Y-axis which are perpendicular to each other. Therefore, the number of markers used in the light exposure step may be at least three, and there may be three or more markers without any problem. Further, in the case where the laser annealing step and the light exposure step are performed on the same substrate, the same markers can be used for the laser annealing step and the light exposure step.

Figure 2A:
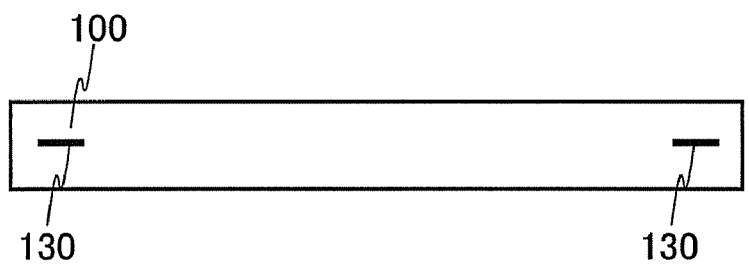
FIGS. 2A and 2B are views showing an outline of a manufacturing process of a substrate with marker of the present invention.
Figure 2B:
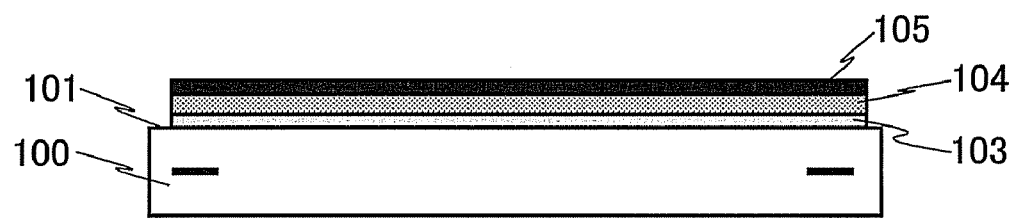

Through the above-described steps, the substrate with marker of the present invention is manufactured. The marker, which is used for alignment, according to the present invention may be any without any problem as long as a marker can be detected by infrared light, and a method for forming the marker is not limited to the method described in this embodiment mode. For example, the marker may be formed in a silicon nitride oxide film, a silicon oxynitride film, or the like below the semiconductor film. Alternatively, a marker 130 used for alignment may be formed directly inside the substrate 100 as shown in FIG. 2A by irradiating the substrate 100 with a laser beam to be ablated. After the marker 130 is formed directly in the substrate 100, as shown in FIG. 2B, the silicon nitride oxide film 103, the silicon oxynitride film 104, the semiconductor film 105, and the like can be formed over the front surface 101 of the substrate 100. Further, the marker 130 can be formed using a femtosecond laser of which a pulse width is extremely short, or the like.

Although FIG. 2A shows an example of forming the marker 130 inside the substrate 100, the marker 130 may be formed directly on a front surface or a back surface of the substrate 100 without any problem. In the case where the marker is formed directly on the substrate, when the substrate is irradiated with light including infrared light, a reflecting property of a region in which the markers are formed is different from that of other regions. Accordingly, the markers can be detected by sensing reflected infrared light.

Alignment of the substrate can be performed in a laser annealing step, a light exposure step, or a laser direct writing step based on the marker of the substrate with marker manufactured in this embodiment mode. It is not necessary to manufacture a marker in part of the semiconductor film of the substrate with marker according to the present invention; therefore, flexibility in designing a circuit can be improved. Further, in laser irradiation in a laser annealing step, there is no fear of contamination of the substrate by scattering the base film. Furthermore, as for the substrate with marker according to the present invention, a marker used for alignment is provided on a back surface of the substrate, inside thereof, or the like; thus, it is particularly effective in the case where there is need to provide a number of markers over the same substrate with increase in size of the substrate.

Embodiment Mode 2

In this embodiment mode, a step of crystallizing a semiconductor film over a front surface of a substrate by irradiating a desired position of the substrate with marker described in Embodiment Mode 1 with a laser beam is described.

An example of a laser irradiation apparatus of the present invention is described with reference to FIG. 3. A laser irradiation apparatus of this embodiment mode includes a laser oscillator 201, a slit 202, a shutter 203, a mirror 204, an optical system 213, a first camera 207, a second camera 208, a θ-axis stage 210, an X-axis stage 211, and a Y-axis stage 212. In this embodiment mode, the optical system 213 includes cylindrical lenses 205 and 206. However, the present invention is not limited to this structure, and the optical system 213 may be an optical system capable of processing a laser beam emitted from the laser oscillator 201 into a linear shape on an irradiated surface. The slit 202, the shutter 203, and the mirror 204 are not necessary to be provided. Further, cameras which sense infrared light are used for the first camera 207 and the second camera 208.

Figure 3:
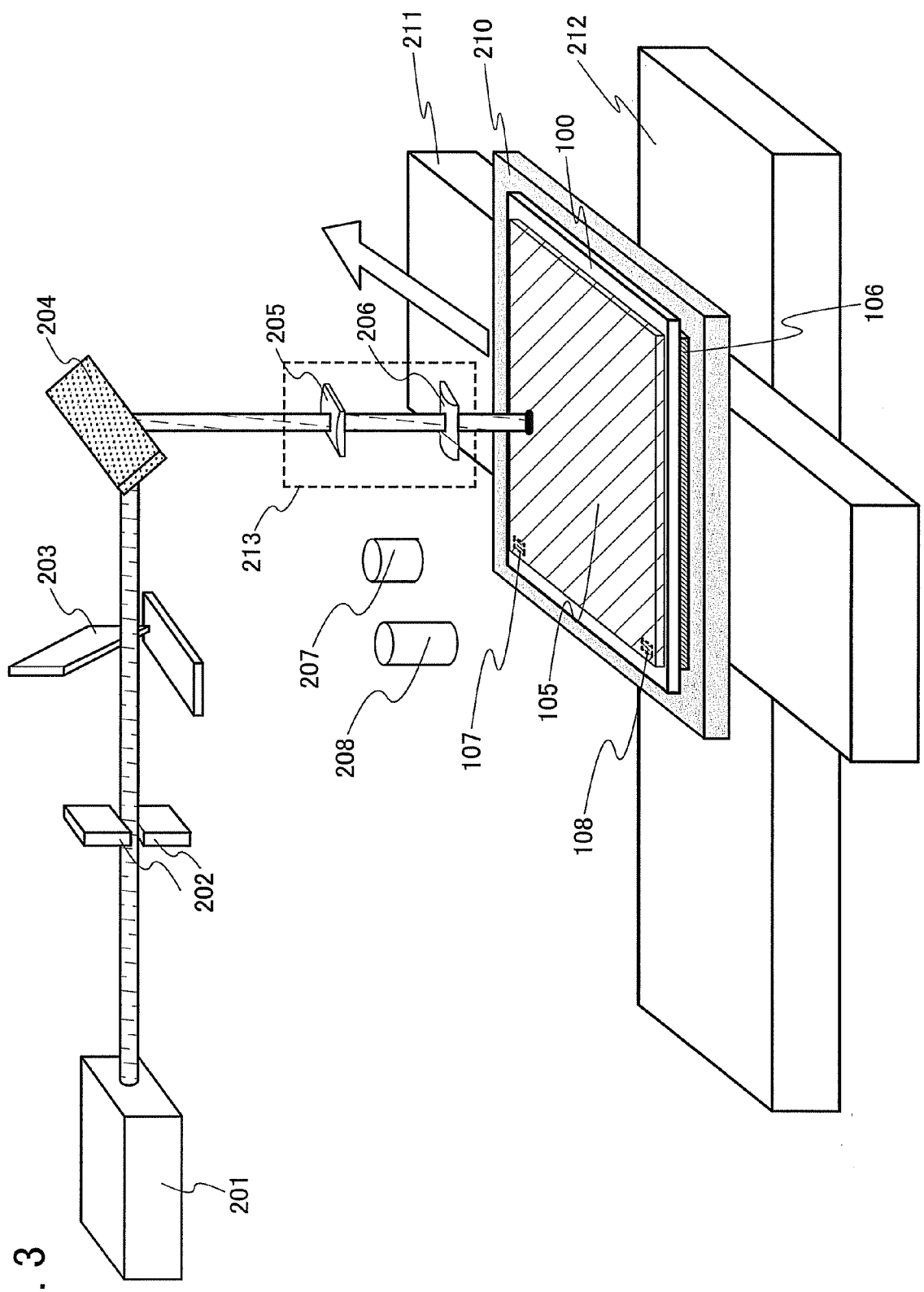
FIG. 3 is a view showing a structure of a laser irradiation apparatus of the present invention.

In this embodiment mode, the laser oscillator 201 shown in FIG. 3 is a laser oscillator of continuous oscillation which oscillates a laser beam converted into a second harmonic by using a nonlinear crystal. As for a laser beam emitted from the laser oscillator 201, a portion having low energy density of the laser beam is blocked by the slit 202, and the laser beam is deflected by the mirror 204 in the perpendicular direction to a semiconductor film 105 formed over a substrate 100.

Subsequently, the laser beam deflected by the mirror 204 is processed into a linear shape by passing through the optical system 213. In this embodiment mode, an image in the slit 202 is projected on the semiconductor film 105 which is an irradiated surface, by a cylindrical lens 205 operating in one direction. At this time, the incident angle of the laser beam with respect to the irradiated surface is vertical.

Further, the laser beam which has passed through the cylindrical lens 205 is condensed by the cylindrical lens 206 of which a direction of action is different by 90° from the cylindrical lens 205, and delivered on the semiconductor film 105. The cylindrical lens 205 acts on the major axis direction of the liner beam in the irradiated surface, while the cylindrical lens 206 acts on the minor axis direction. In this manner, the laser beam deflected by the mirror 204 can be processed into a linear shape by passing through the two cylindrical lenses 205 and 206.

Next, a method of crystallizing a semiconductor film with the use of the laser irradiation apparatus shown in FIG. 3 is described.

First, the substrate 100 having markers 107 and 108 is prepared over the θ-axis stage 210 capable of transmitting infrared light with a wavelength of approximately 800 to 1500 nm. The θ-axis stage 210 may be any as long as infrared light can be transmitted in a region overlapping with a marker of a substrate with marker, which is mounted thereon. For example, the θ-axis stage 210 can have an opening in the region overlapping with the marker. Alternatively, the θ-axis stage may be formed using a material which transmits infrared light. In this embodiment mode, a marker formation film 106 is formed on a back surface of the substrate 100. The semiconductor film 105 is formed over a front surface of the substrate 100 (the side opposite to the marker formation film 106 with the substrate 100 interposed therebetween). The number of the markers formed using the marker formation film 106 is not particularly limited as long as it is two or more. Any number of markers may be provided as long as an irradiation position of the laser can be fixed.

Subsequently, the markers 107 and 108 are detected using the first camera 207 and the second camera of which power is higher than that of the first camera. In this embodiment mode, the marker is detected using the first camera, coarse-adjustment alignment of the position of the substrate is performed, and then, the marker is detected using the second camera and the position of the substrate is finely adjusted. In general, to perform alignment with high precision, the camera preferably has power as high as possible; however, in the case where alignment is performed using only a high-powered camera, it is highly possible that the marker does not enter the field of view. Therefore, alignment is performed using a low-powered camera with a wide field of view before using a high-powered camera; thus, alignment of the substrate can be easily performed precisely. It is not always necessary to provide two cameras which sense infrared light for detecting a marker, and one camera or three or more cameras may be provided. It is to be noted that in the case of using one camera, it is preferable to use a camera capable of changing its power from low power to high power. Further, in the case of using a plurality of cameras, it is preferable to use cameras each having different power sequentially from a low-powered camera.

In coarse-adjustment alignment using the first camera 207, the position of the marker 107 formed on the back surface of the substrate is detected in such a manner that the semiconductor film 105 is irradiated with light including infrared light, and reflected light which is reflected by the marker is sensed by the first camera 207 provided above the stage. Here, image processing such as pattern matching processing is performed on an image signal with the use of an image processing device connected to the first camera 207, whereby the position of the marker 107 is detected. Subsequently, based on positional information of the marker 107 obtained by pattern matching processing or the like, the θ-axis stage 210, the X-axis stage 211, and the Y-axis stage 212 are moved appropriately so that the marker 107 enters the center of the field of view of the first camera 207. Then, the X-axis stage 211 is moved by a distance between the marker 107 and the marker 108, which is set in advance. Then, the position of the marker 108 is detected using the first camera 207 in a similar manner to the case of the marker 107, and the θ-axis stage 210 is moved appropriately so that the marker 108 enters the center of the field of view of the first camera 207. Subsequently, the X-axis stage 211 and the θ-axis stage 210 are moved again so that the marker 107 enters the center of the field of view of the first camera 207. In this manner, the above-described operation is repeated until both the marker 107 and the marker 108 enter the center of the field of view of the first camera 207, and a θ-axis direction is adjusted so that a line segment connecting the marker 107 and the marker 108 and a moving direction of the X-axis stage 211 are parallel to each other.

Subsequently, fine-adjustment alignment is performed using the second camera 208 provided above the stage. In a similar manner to the coarse-adjustment alignment using the first camera 207, a θ-axis direction is adjusted using the second camera 208 so that the line segment connecting the marker 107 and the marker 108 and a moving direction of the X-axis stage 211 are parallel to each other. That is, first, image processing such as pattern matching processing is performed on an image signal with the use of an image processing device connected to the second camera 208, whereby the position of the marker 107 is detected. Subsequently, based on positional information of the marker 107 obtained by pattern matching processing or the like, the θ-axis stage 210, the X-axis stage 211, and the Y-axis stage 212 are moved appropriately so that the marker 107 enters the center of the field of view of the first camera 207. Then, the X-axis stage 211 is moved by a distance between the marker 107 and the marker 108, which is set in advance. Then, the position of the marker 108 is detected using the first camera 207 in a similar manner to the case of the marker 107, and the θ-axis stage 210 is moved appropriately so that the marker 108 enters the center of the field of view of the first camera 207. Subsequently, the X-axis stage 211 and the θ-axis stage 210 are moved again so that the marker 107 enters the center of the field of view of the second camera 208. In this manner, the above-described operation is repeated until both the marker 107 and the marker 108 enter the center of the field of view of the second camera 208, and the θ-axis direction is finely adjusted so that the line segment connecting the marker 107 and the marker 108 and a moving direction of the X-axis stage 211 are parallel to each other.

In adjusting the θ-axis direction, not only the θ-axis stage but also the X-axis stage and the Y-axis stage may be appropriately moved, if necessary. Further, in this embodiment mode, two cameras which sense infrared light are used for alignment; however, the embodiment mode of the present invention is not limited to this. That is, the number of cameras which sense infrared light may be one, and there may be three or more cameras without any problem. Furthermore, a camera may be provided below the stage, and infrared light transmitted through an opening of the marker formation film may be detected using the camera provided below the stage.

After performing alignment of the substrate as described above, a laser beam is emitted from the laser oscillator 201, a surface of the semiconductor film 105 is irradiated with a linear beam processed into a linear shape through the optical system 213 to crystallize the semiconductor film. The X-axis stage 211 and the Y-axis stage 212 are appropriately scanned from front to back and from side to side, whereby an entire surface of the substrate 100 can be irradiated with the linear beam and an entire surface of the semiconductor film 105 can be crystallized.

In this embodiment mode, the markers 107 and 108 used for alignment are arranged so that the line segment connecting the two markers and a channel direction of a TFT are parallel to each other. Therefore, by detecting the markers 107 and 108 and adjusting an angle of a rotation direction with the use of the θ-axis stage 210, the channel direction of the TFT and a scanning direction of the linear beam can be made parallel to each other. In general, if the channel direction of the TFT and the scanning direction of the linear beam are not in parallel to each other, a poorly crystalline region may be formed in a position where a TFT is formed, which becomes the cause of reduction in yield. However, by using a laser irradiation method described in this embodiment mode, the channel direction of the TFT and the scanning direction of the linear beam can be made parallel; therefore, a poorly crystalline region is not formed in a position where a TFT is formed, and yield can be improved.

If the shutter 203 is set so that it is opened when the substrate 100 is irradiated with the laser beam and closed when the substrate passes away in synchronization with the movement of the X-axis stage 211, safety of the apparatus is further secured. The shutter 203 is desirably located in a position closer to an irradiated surface than the slit 202. The shutter 203 is disposed closer to the irradiated surface than the slit, whereby the slit 202 is irradiated with the laser beam and the slit 202 is continuously heated even if the shutter 203 is closed. Accordingly, temperature of the slit 202 is maintained almost constant, and the slit 202 is not easily subjected to thermal expansion or thermal shrinkage. As a result, a length of the linear beam on the irradiated surface is constant, which makes a further contribution to precise alignment.

In this embodiment mode, the alignment marker provided for the substrate is detected using a camera or the like which senses infrared light and detects a position, whereby alignment of the substrate can be performed precisely, and the semiconductor film can be irradiated with the laser beam with high precision. Since the marker used for alignment is not formed in the semiconductor film, flexibility in designing a circuit can be improved. There is no fear of contaminating the substrate by scattering the base film in laser irradiation. Furthermore, since a desired position of the semiconductor film can be irradiated with a laser beam accurately, laser annealing can be performed on the desired position uniformly. Accordingly, a TFT with a good characteristic can be manufactured efficiently.

Embodiment Mode 3

This embodiment mode shows the case where the substrate with marker described in Embodiment Mode 1 is applied to a light exposure step using a photolithography method.

An example of a light exposure apparatus of the present invention is described with reference to FIG. 4. The light exposure apparatus of the present invention includes a light source 501, a shutter 503, a fly-eye lens 504, a reticle blind 505, a mirror 506, a condenser lens 507, a photomask 508, a projection lens 509, a first camera 207, a second camera 208, a θ-axis stage 210, an X-axis stage 211, and a Y-axis stage 212. It is to be noted that the embodiment mode of the present invention is not limited to this structure. For example, the fly-eye lens 504, which is provided so that intensity distribution of a light beam emitted from the light source 501 is made uniform on an irradiated surface, may be replaced with two or more of an array lens, a collimation lens, a field lens, and the like. The reticle blind 505 is provided to adjust an area of a light beam with which the photomask 508 is irradiated. Therefore, the reticle blind is not particularly needed when it is not necessary to adjust the area of the light beam. Further, the shutter 503, a mirror 502, and the mirror 506 are not necessary to be provided. As the first camera 207 and the second camera 208, a camera which senses infrared light is used. The projection lens 509 is to reduce the size of an image formed using the photomask 508, and for example, a convex spherical lens can be used. As the light source 501, for example, a laser such as krypton fluoride (KrF) or argon fluoride (ArF) can be used. Extreme ultraviolet ray (EUV) can alternatively be used when the entire apparatus is put in a vacuum chamber. Further alternatively, a mercury lamp can also be used. In this embodiment mode, a mercury lamp is used as the light source 501.

A light exposure apparatus of the present invention includes a photomask stage (not shown) for scan of the photomask 508 in synchronization with scan of the θ-axis stage 210, the X-axis stage 211, and the Y-axis stage 212.

Figure 4:
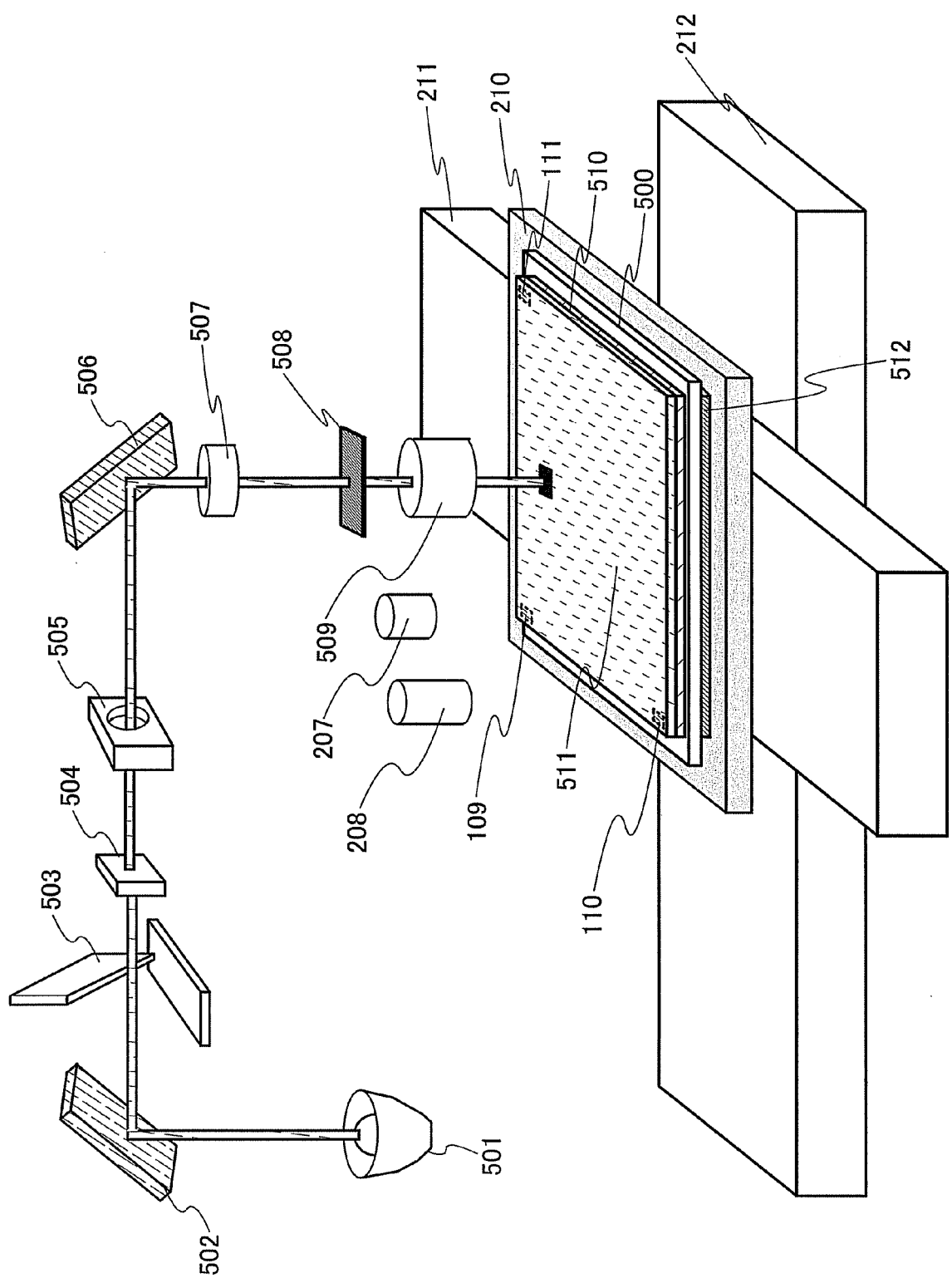
FIG. 4 is a view showing a structure of a light exposure apparatus of the present invention.

In the photomask 508 in FIG. 4, a line pattern with a desired pattern formed by minutely processing a light-shielding film is formed, and transmission or non-transmission of the laser beam is selected depending on existence of the light-shielding film.

Next, a method for performing a light exposure step of a photolithography method with the use of the laser irradiation apparatus shown in FIG. 4 is described.

First, a substrate 100 having markers 109, 110, and 111 used for alignment is prepared over the θ-axis stage 210 capable of transmitting infrared light with a wavelength of approximately 800 to 1500 nm. The θ-axis stage 210 may be any as long as infrared light can be transmitted in a region overlapping with the marker of the substrate with marker, which is mounted thereon. For example, the θ-axis stage 210 can have an opening in the region overlapping with the marker. Alternatively, the θ-axis stage may be formed using a material which transmits infrared light. In this embodiment mode, a marker formation film 512 is formed on a back surface of the substrate 100. Further, a semiconductor film 510 is formed over a front surface of the substrate 500 (the side opposite to the marker formation film 106 with the substrate 500 interposed therebetween), and a photoresist 511 is formed over the semiconductor film 510. The semiconductor film 510 is crystallized by a method or the like described in Embodiment Mode 2, and a top surface thereof is coated with a photoresist using a spin coater, a slit coater, or the like. As the photoresist, an object with photosensitivity with respect to the light source of the light irradiation apparatus used in the light exposure step is appropriately selected. Further, as the photoresist, a positive photoresist, a negative photoresist, or the like can be appropriately selected and used.

Subsequently, the markers 109, 110, and 111 are detected using the first camera 207 and the second camera of which power is higher than that of the first camera. In this embodiment mode, the marker is detected using the first camera and coarse-adjustment alignment of the position of the substrate is performed, and then, the marker is detected using the second camera and the position of the substrate is finely adjusted. It is not always necessary to provide two cameras which sense infrared light for detecting a marker, and one camera or three or more cameras may be provided. It is to be noted that in the case of using one camera, it is preferable to use a camera capable of changing its power from low power to high power. Further, in the case of using a plurality of cameras, it is preferable to use cameras each having different power sequentially from a low-powered camera. Furthermore, the number of markers formed using the marker formation film is not particularly limited as long as the number is at least three, and any number of markers may be provided as long as coordinates of the marker on the X-axis and the Y-axis which are perpendicular to each other can be fixed.

In coarse-adjustment alignment using the first camera 207, the position of the marker 109 formed on the back surface of the substrate is detected in such a manner that the substrate over the stage is irradiated with light including infrared light, and infrared light which is reflected by the marker formation film is detected using the first camera 207 provided above the stage. Here, image processing such as pattern matching processing is performed on an image signal with the use of an image processing device connected to the first camera 207, whereby the position of the marker 109 is detected. Subsequently, based on positional information of the marker 109 obtained by pattern matching processing or the like, the θ-axis stage 210, the X-axis stage 211, and the Y-axis stage 212 are moved appropriately so that the marker 109 enters the center of the field of view of the first camera 207. Then, the X-axis stage 211 is moved by a distance between the marker 109 and the marker 110, which is set in advance. Then, the position of the marker 110 is detected using the first camera 207 in a similar manner to the case of the marker 109, and the θ-axis stage 210 is moved appropriately so that the marker 110 enters the center of the field of view of the first camera 207. Subsequently, the X-axis stage 211 and the θ-axis stage 210 are moved again so that the marker 109 enters the center of the field of view of the first camera 207. In this manner, the above-described operation is repeated until both the marker 109 and the marker 110 enter the center of the field of view of the first camera 207, and a θ-axis direction is adjusted so that a line segment connecting the marker 109 and the marker 110 and a moving direction of the X-axis stage 211 are parallel to each other.

Subsequently, fine-adjustment alignment is performed using the second camera 208 provided above the stage. First, image processing such as pattern matching is performed on an image signal with the use of an image processing device connected to the second camera 208, whereby the position of the marker 109 is detected. Subsequently, based on positional information of the marker 109, the θ-axis stage 210, the X-axis stage 211, and the Y-axis stage 212 are moved appropriately so that the marker 109 enters the center of the field of view of the first camera 207. Then, the X-axis stage 211 is moved by a distance between the marker 109 and the marker 110, which is set in advance. Then, the position of the marker 110 is detected using the first camera 207 in a similar manner to the case of the marker 109, and the θ-axis stage 210 is moved appropriately so that the marker 110 enters the center of the field of view of the first camera 207. Subsequently, the X-axis stage 211 and the θ-axis stage 210 are moved again so that the marker 109 enters the center of the field of view of the second camera 208. In this manner, the above-described operation is repeated until both the marker 109 and the marker 110 enter the center of the field of view of the second camera 208, and the θ-axis direction is finely adjusted so that the line segment connecting the marker 109 and the marker 110 and a moving direction of the X-axis stage 211 are parallel to each other. At the termination of fine-adjustment alignment, coordinates of each of the markers 109 and 110 in the X-axis stage and the Y-axis stage and a rotation angle (coordinates) of the θ-axis stage are stored in the light exposure apparatus side, and the marker 109 is set as a reference point.

In adjusting the θ-axis direction, not only the θ-axis stage but also the X-axis stage and the Y-axis stage may be appropriately moved, if necessary. Further, in this embodiment mode, two cameras which sense infrared light are used for alignment; however, the embodiment mode of the present invention is not limited to this. That is, the number of cameras which sense infrared light may be one, and there may be three or more cameras without any problem. Furthermore, a substrate with marker of the present invention may be mounted on the stage which transmits infrared light, and infrared light transmitted through an opening of the marker formation film may be detected using the camera provided below the stage.

Next, the X-axis stage and the Y-axis stage are moved by a distance calculated in advance using the marker 109 as a reference point so that the marker 111 enters the field of view of the second camera 208. After the movement, image processing of the marker 111 which has entered the field of view of the second camera 208 is performed, and it is checked whether or not the marker 111 is at coordinates within a certain margin of error. If the marker 111 is at coordinates within the certain margin of error, alignment is terminated here. At the termination of the alignment, coordinates of the marker 111 in the X-axis stage and the Y-axis stage are stored in the light exposure apparatus. Alternatively, if the marker 111 is at coordinates which exceed the certain error range, fine-adjustment alignment of the marker 109 is performed again using the second camera 208, and the above-described operation is repeated.

After performing alignment as described above, light is emitted from the light source 501 to expose the photoresist formed over the substrate 500 to light. In this embodiment mode, the light source 501 is formed by combining a mercury lamp and an elliptical mirror. The mercury lamp emits i-line (wavelength: 365 nm) which is ultraviolet light, and the emitted light beam is emitted in a direction of the mirror 502 by the elliptical mirror. The light beam deflected by the mirror 502 reaches the fly-eye lens 504. The intensity distribution of the light beam which has passed through the fly-eye lens 504 is made uniform. Subsequently, the size of the reticle blind 505 is varied as desired, so that only the light beam necessary for light exposure is allowed to pass therethrough. When the light beam is allowed to pass through the reticle blind 505, an area of the light beam with which the photomask 508 is irradiated can be adjusted. The light beam which has passed through the reticle blind 505 is deflected by the mirror 506 in a direction of the irradiated surface and then reaches the condenser lens 507, which transmits an image of light formed in the reticle blind 505 to the photomask 508. An enlarged object of a desired pattern which is to be formed in the semiconductor film is formed in the photomask 508, and an image of light formed through the photomask 508 is subjected to reduction projection with respect to the irradiated surface by the projection lens 509. A portion of the photoresist irradiated with the image of the light projected by this is exposed to light.

Subsequently, the X-axis stage 211 and the Y-axis stage 212 are appropriately scanned from front to back and from side to side, whereby the substrate 500 is appropriately irradiated with the light beam and the photoresist is exposed to light.

It is to be noted that the shutter 503 may be appropriately opened and closed to be used for control of light exposure time.

Then, a developing solution is dropped to the photoresist or sprayed from a spray nozzle, whereby the photoresist which is exposed to light is developed.

After that, the developed photoresist is subjected to heat treatment (also referred to as postbaking) to remove moisture or the like remaining in the resist mask and to enhance stability to heat. For example, postbaking can be performed by heating at 125° C. for 180 seconds. Through the above-described steps, a resist mask is formed. The semiconductor film is etched based on the resist mask, and patterned into a desired shape.

In this embodiment mode, the marker used for alignment provided for the substrate is detected using a camera or the like which detects a position and senses infrared light, whereby alignment of the substrate can be performed precisely, and the photoresist formed over the substrate can be exposed to light with high precision. Further, since the marker is not formed in the semiconductor film, flexibility in designing a circuit can be improved. Furthermore, since a desired position of the semiconductor film can be irradiated with a light beam, the desired position can be patterned accurately. Accordingly, a TFT with a good characteristic can be manufactured efficiently.

Embodiment Mode 4

In this embodiment mode, a step of manufacturing a thin film transistor (TFT) with the use of a laser irradiation apparatus shown in FIG. 3 or a light exposure apparatus shown in FIG. 4 is described. In this embodiment mode, a method for manufacturing a top gate (staggered) TFT is described; however, the present invention can be similarly used for a bottom gate (inverted staggered) TFT, without limitation to a top gate TFT. It is to be noted that the present invention can be implemented in various different modes, and it will be readily apparent to those skilled in the art that various changes and modifications in modes and details thereof can be made without departing from the purpose and scope of the present invention. Therefore, the present invention should not be interpreted as being limited to the description of this embodiment mode.

Figure 5:
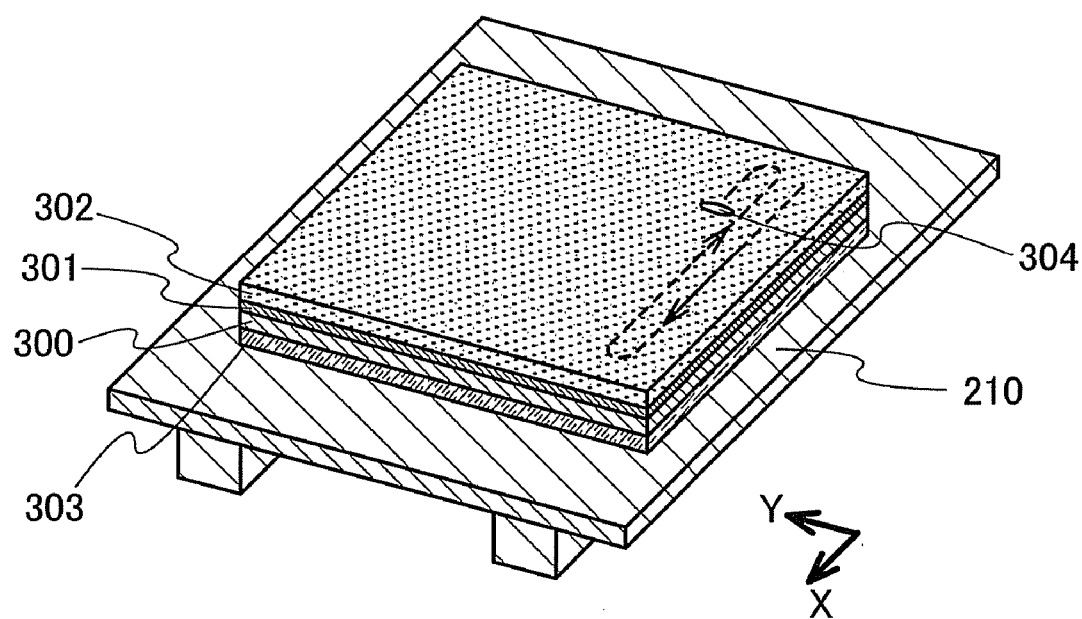
FIG. 5 is a view showing a state of laser irradiation using a laser irradiation apparatus of the present invention.

FIG. 5 shows a θ-axis stage 210 in FIG. 3 or FIG. 4. The θ-axis stage 210 may be any as long as infrared light can be transmitted in a region overlapping with a marker of the substrate with marker, which is mounted thereon. For example, the stage 210 can have an opening in a region overlapping with a marker. Alternatively, the θ-axis stage may be formed using a material which transmits infrared light. The θ-axis stage 210 has a suction hole by which the substrate is fixed, and the θ-axis stage 210 can be moved in a θ-axis direction. First, as shown in FIG. 5, an object obtained by sequentially forming an insulating surface, a base film 301, and an amorphous semiconductor film 302 over the substrate 300 is placed over the θ-axis stage 210 having a suction function. The substrate 300 has a marker formation film 303, which is formed using a material which does not transmit infrared light with a wavelength of approximately 800 to 1500 nm, on its back surface. As the substrate 300, for example, a glass substrate made of barium borosilicate glass, aluminoborosilicate glass, or the like, a quartz substrate, a stainless steel substrate, or the like can be used. Moreover, a substrate made of a synthetic resin having flexibility, such as acrylic or plastic typified by PET, PES, or PEN generally tends to have lower heat resistance than other substrates; however, the substrate can be used as long as it can withstand process temperature in the manufacturing steps.

The base film 301 is formed in order to prevent alkaline earth metal or alkali metal such as Na contained in the substrate 300 from diffusing into the semiconductor film. When alkali metal or alkaline earth metal exists in the semiconductor film, such metal adversely affects the characteristic of a semiconductor element. Therefore, the base film 301 is formed of an insulating film such as silicon oxide, silicon nitride, silicon oxide containing nitrogen, or silicon nitride containing oxygen, which can suppress the diffusion of alkali metal and alkaline earth metal into the semiconductor film. For example, a silicon nitride oxide film is formed with a thickness from 10 to 400 nm by a plasma CVD method. In the case of using a substrate containing even a small amount of alkali metal or alkaline earth metal, such as a glass substrate or a plastic substrate, it is effective to provide the base film 301 in point of preventing the diffusion of impurities; however, the base film is not necessarily provided when the diffusion of impurities does not lead to any significant problems, like in the case of using a quartz substrate.

The amorphous semiconductor film 302 with a thickness of approximately 25 to 100 nm (preferably 30 to 60 nm) is formed over the base film 301. As the amorphous semiconductor film, silicon or silicon containing germanium can be used. In the case of using silicon containing germanium, the concentration of germanium preferably ranges from about 0.01 to 4.5 atomic %. Subsequently, the amorphous semiconductor film 302 is crystallized with the use of the laser irradiation apparatus of the present invention.

Figure 6:
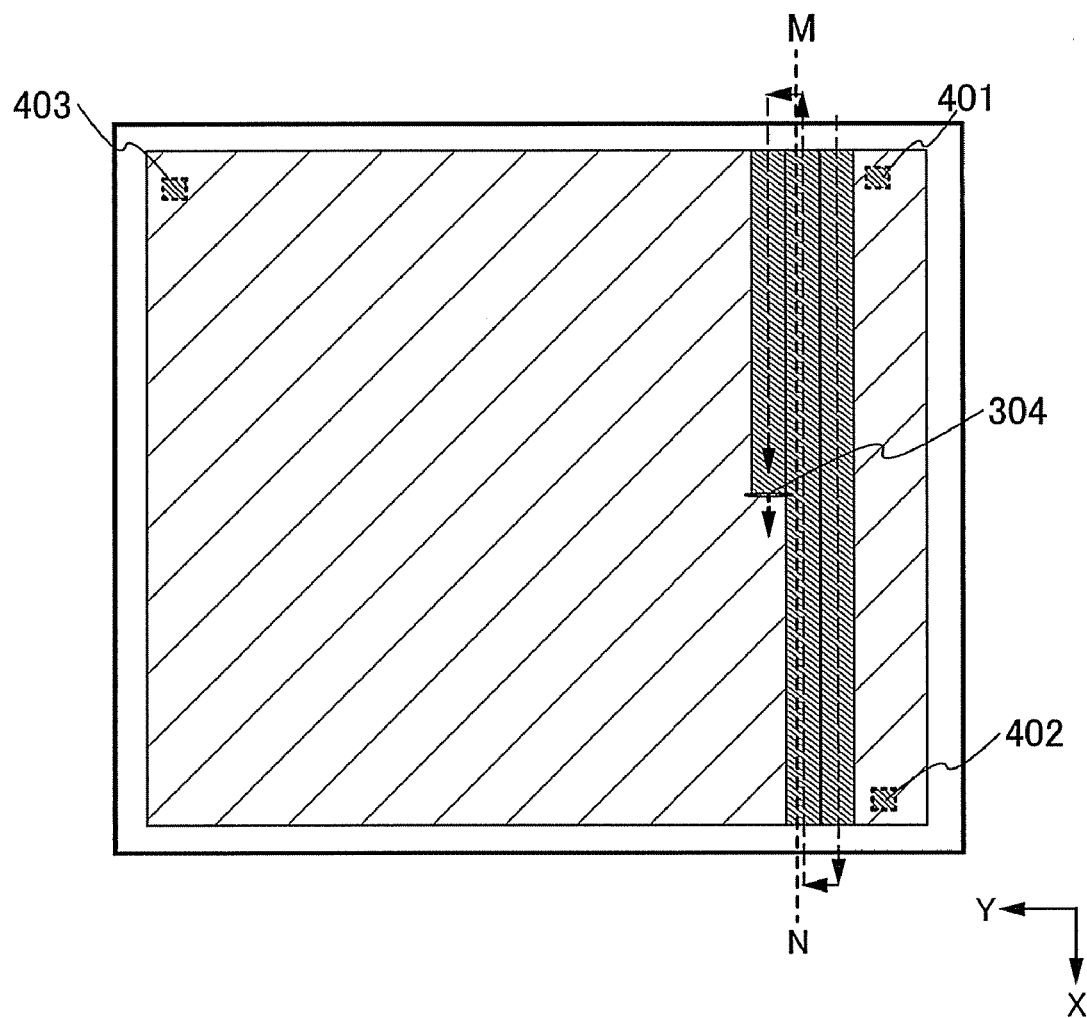
FIG. 6 is a view showing a state of laser irradiation using a laser irradiation apparatus of the present invention.

FIG. 6 shows a schematic view of a top view of the amorphous semiconductor film 302. Here, markers 401, 402, and 403 used for alignment are formed in advance in the marker formation film 303 formed on a back surface of the substrate 300 by a photolithography method. The number of markers is not particularly limited, and any number of markers may be provided as long as a position to be irradiated with a laser beam can be fixed or coordinates of the marker on an X-axis and a Y-axis which are perpendicular to each other can be fixed. Here, a position to be irradiated with a linear beam 304 is adjusted by a method described in Embodiment Mode 2. That is, although not shown, the markers 401 and 402 are detected using a camera capable of sensing infrared light, and a position of the substrate is adjusted so that a line segment connecting the markers 401 and 402 and an X-axis direction are parallel to each other. In this embodiment mode, the markers used for alignment are formed in the marker formation film 703 on the back surface of the substrate; however, the marker may be formed directly in the substrate 300 by utilizing laser ablation or the like. In that case, the marker may be formed on a front surface or a back surface of the substrate having an insulating surface, or may be formed inside the substrate.

Figure 7A:
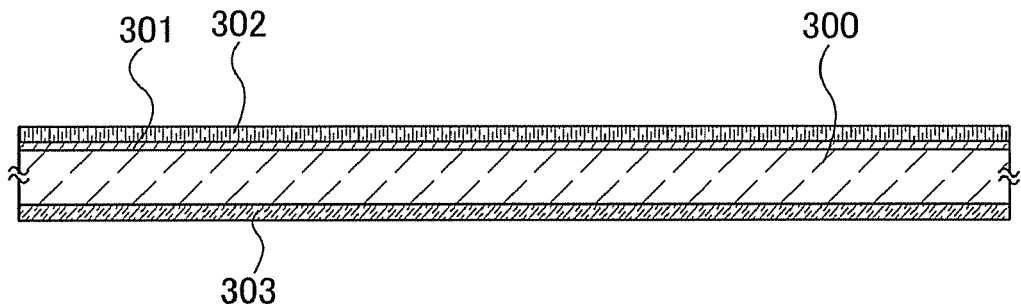
FIGS. 7A to 7D are views showing an outline of a manufacturing process of a TFT using a light irradiation apparatus of the present invention.
Figure 7B:
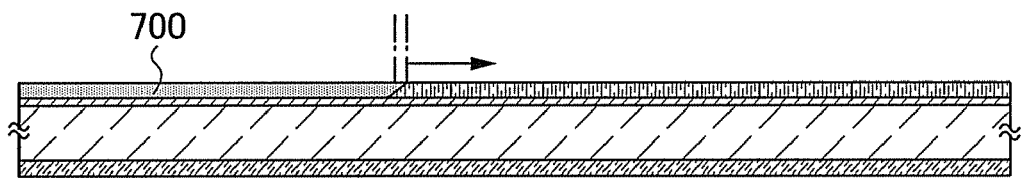

FIGS. 7A to 7D are cross-sectional views taken along the dashed line connecting M and N in FIG. 6. As shown in FIG. 7A, the base film 301 and the amorphous semiconductor film 302 are sequentially stacked over the substrate 300. The marker formation film 303 is formed on a back surface of the substrate 300. A surface of the amorphous semiconductor film 302 is scanned with a linear beam in a direction indicated by an arrow shown in FIG. 7B. With the linear beam irradiation, a crystal grain continuously grown in a scanning direction is formed. In this embodiment mode, by a laser irradiation method described in Embodiment Mode 2, a scanning direction of the linear beam and a direction where carriers move in a channel region of a TFT can be made parallel to each other. Thus, TFTs with almost no crystal grain boundaries in a direction where carriers move in a channel region in the crystalline semiconductor film 700 can be formed by forming crystal grains extending long in the scanning direction of the linear beam.

Figure 7C:
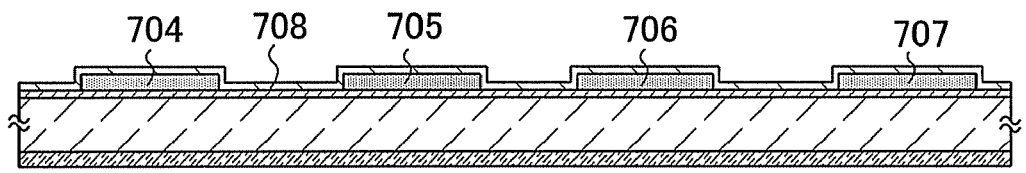

After that, the crystalline semiconductor film 700 is etched as shown in FIG. 7C, thereby forming island-shaped semiconductor films 704 to 707. By using the island-shaped semiconductor films 704 to 707, various semiconductor elements typified by TFTs are formed. Next, a gate insulating film 708 is formed so as to cover the island-shaped semiconductor films 704 to 707. The gate insulating film 708 can be formed using, for example, silicon oxide, silicon nitride, or silicon nitride oxide by a plasma CVD method, a sputtering method, or the like. For example, an insulating film containing silicon with a thickness of 30 to 200 nm may be formed by a sputtering method.

Figure 7D:
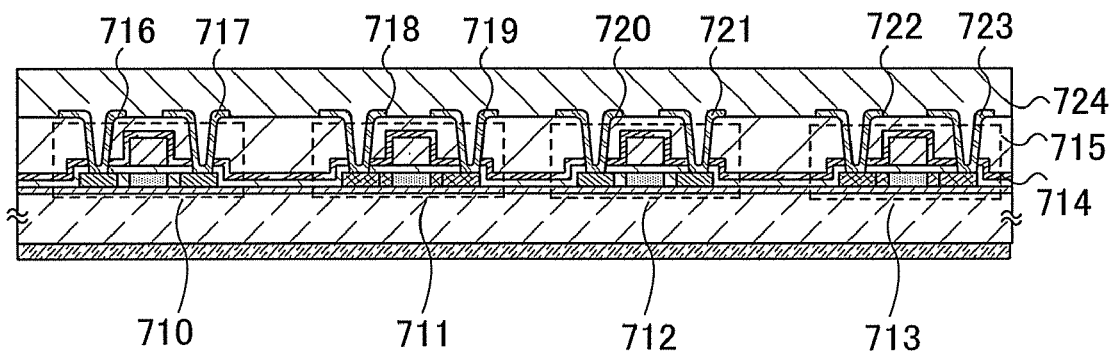

Next, a conductive film is formed over the gate insulating film 708 and etched, whereby a gate electrode is formed. After that, impurities imparting an n-type or p-type conductivity type are selectively added to the island-shaped semiconductor films 704 to 707 by using the gate electrode or an etched resist as a mask, whereby a source region, a drain region, an LDD region, and the like are formed. By the above-mentioned steps, N-type transistors 710 and 712, and P-type transistors 711 and 713 can be formed over one substrate (FIG. 7D). Subsequently, an insulating film 714 is formed to protect those transistors. This insulating film 714 may be formed in a single-layer structure or a stacked structure with an insulating film containing silicon of 100 to 200 nm thick by a plasma CVD method or a sputtering method. For example, a silicon oxynitride film of 100 nm thick may be formed by a plasma CVD method.

An organic insulating film 715 is formed over the insulating film 714. The organic insulating film 715 is formed using an organic insulating film such as polyimide, polyamide, BCB, or acrylic applied by an SOG method. The organic insulating film 715 is preferably formed using a film superior in flatness because the insulating film 715 is formed mainly with a purpose of relaxing and flattening the unevenness due to TFTs formed over the substrate 300. Moreover, by a photolithography method, the insulating film 714 and the organic insulating film 715 are processed by patterning to form a contact hole therein that reaches the impurity region.

Next, a conductive film is formed using a conductive material and patterned, thereby forming wirings 716 to 723. After that, an insulating film 724 is formed as a protective film, whereby a semiconductor device shown in FIG. 7D is completed.

Further, in each step of a manufacturing method of a TFT described in the above, in a light exposure step of a photolithography method, a position of light irradiation may be adjusted with the use of a light exposure apparatus of the present invention, which is shown in FIG. 4. That is, although not shown here, a position of the substrate 500 can be adjusted by detecting the markers 401, 402, and 403 using a camera which senses infrared light. By using the light exposure apparatus according to the present invention, a photoresist formed over the substrate can be exposed to light with high precision.

The manufacturing method of a semiconductor device using a laser irradiation apparatus or a light exposure apparatus of the present invention is not limited to the above-mentioned manufacturing steps of TFTs described above. In the present invention, the crystalline semiconductor film obtained by the laser irradiation is used as an active layer of a TFT. Accordingly, it is possible to suppress the variation in electron field-effect mobility, threshold voltage, and on-current between the elements.

A crystallization step using a catalytic element may be provided before the crystallization using the laser beam. As the catalytic element, nickel (Ni), germanium (Ge), iron (Fe), palladium (Pd), tin (Sn), lead (Pb), cobalt (Co), platinum (Pt), copper (Cu), or gold (Au) can be used. When the crystallization step by the laser beam is conducted after this crystallization step using a catalytic element, the laser light irradiation melts an upper part of the semiconductor film but does not melt a lower part of the semiconductor film. Therefore, a crystal remaining without being melted in the lower part of the semiconductor film becomes a crystal nucleus, and the crystallization is promoted from the lower part toward the upper part of the semiconductor film.

Therefore, as compared with the case of performing only a crystallization step by the laser beam, the crystallinity of the semiconductor film can be enhanced further and the roughness of the surface of the semiconductor film after the crystallization by the laser beam can be suppressed. Thus, the variation in the characteristic between semiconductor elements to be formed afterward, typically TFTs, can be suppressed further, and the off-current can be suppressed. It is noted that the crystallization may be performed in such a way that the heat treatment is performed after the catalyst element is added in order to promote the crystallization and that the laser irradiation is performed in order to enhance the crystallinity further. Alternatively, the heat treatment may be omitted. Specifically, after adding the catalyst element, the semiconductor film may be irradiated with the laser beam instead of the heat treatment so as to enhance the crystallinity.

This embodiment mode shows an example in which alignment using the substrate with marker of the present invention is used for crystallization of the semiconductor film and a light exposure step in a photolithography method. However, the alignment using the substrate with marker of the present invention may be used for shaping of a laser semiconductor element, a laser direct writing method, or the like. The manufacturing method of a semiconductor device using the present invention can also be used for manufacturing methods of an integrated circuit and a semiconductor display device. Transistors applied to a functional circuit such as a driver or a CPU preferably have an LDD structure or a structure in which an LDD overlaps with a gate electrode. For higher-speed operation, transistors are preferably reduced in size. Since the transistors 710 to 713 completed by this embodiment mode have LDD structures, the transistors 710 to 713 are preferably used in a driver circuit requiring low Ioff value.

In this embodiment mode, the marker used for alignment provided for the substrate is detected using a camera or the like which detects a position and senses infrared light, whereby alignment of the substrate can be performed precisely, and the semiconductor film can be irradiated with the laser beam with high precision. Further, since a desired position over the substrate can be irradiated with a light beam from the light source, the desired position can be patterned accurately. Since the marker is not formed in the semiconductor film, flexibility in designing a circuit can be improved. In addition, there is no fear of contaminating the substrate by scattering the base film in laser irradiation. Furthermore, since a desired position of the semiconductor film can be irradiated with a laser beam accurately, laser annealing can be performed on the desired position uniformly. Accordingly, a TFT with a good characteristic can be manufactured efficiently.

Embodiment Mode 5

This embodiment mode shows a process in which a thin film integrated circuit or a non-contact type thin film integrated circuit device (a wireless chip, a wireless IC tag, an RFID (also referred to as radio frequency identification)) is manufactured with the use of a laser irradiation apparatus shown in FIG. 3 or a light exposure apparatus shown in FIG. 4. It is to be noted that the present invention can be implemented in various different modes, and it will be readily apparent to those skilled in the art that various changes and modifications in modes and details thereof can be made without departing from the purpose and scope of the present invention. Therefore, the present invention should not be interpreted as being limited to the description of this embodiment mode.

Although electrically-isolated TFTs are shown as semiconductor elements to be used in an integrated circuit of a wireless IC tag in the following example, the semiconductor elements used in an integrated circuit of a wireless IC tag are not limited to TFTs, but any kinds of elements can be used. For example, a storage element, a diode, a photoelectric conversion element, a resistor element, a coil, a capacitor element, an inductor, and the like are typically given in addition to a TFT.

Figure 8:
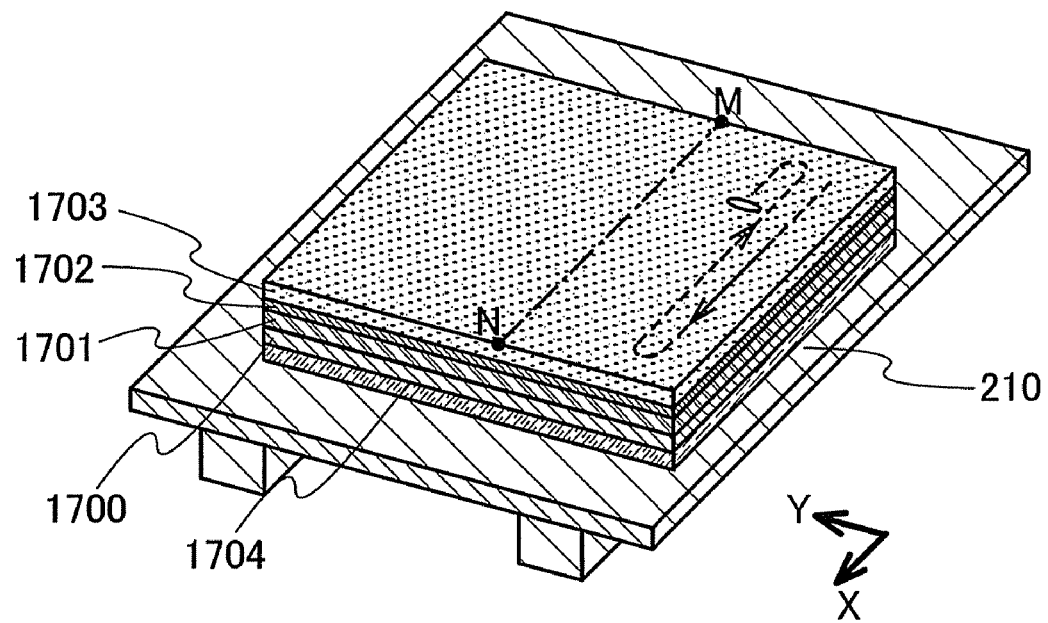
FIG. 8 is a view showing a state of laser irradiation using a laser irradiation apparatus of the present invention.

FIG. 8 shows a θ-axis stage 210 in FIG. 3 or FIG. 4. The θ-axis stage 210 may be any as long as infrared light can be transmitted in a region overlapping with a marker of the substrate with marker, which is mounted thereon. For example, the θ-axis stage 210 can have an opening in a region overlapping with a marker. Alternatively, the θ-axis stage may be formed using a material which transmits infrared light. The θ-axis stage 210 has a suction hole by which the substrate is fixed, and the θ-axis stage 210 can be moved in a θ-axis direction. As shown in FIG. 8, an object obtained by sequentially forming a separation layer 1701, a base insulating film 1702, and a semiconductor film 1703 over a front surface of a substrate (a first substrate) 1700, and forming a marker formation film 1704 on a back surface thereof is placed over the θ-axis stage. Steps up to the formation of the semiconductor film 1703 are described.

First, the marker formation film 1704 is formed by a CVD method or a sputtering method on the back surface of the substrate 1700. Any kind of a film can be used for the marker formation film 1704 as long as the film does not transmit infrared light with a wavelength of approximately 800 to 1500 nm, and for example, the film may be formed using a material including at least one kind of metal such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), titanium (Ti), and rhodium (Rh). Subsequently, the separation layer 1701 is formed over the substrate (the first substrate) 1700. The separation layer 1701 can be formed using a sputtering method, a low-pressure CVD method, a plasma CVD method, or the like. In this embodiment mode, a film of amorphous silicon with a thickness of approximately 50 nm is formed by a sputtering method and used as the separation layer 1701. The material for the separation layer 1701 is not limited to silicon, and may be a material which can be selectively etched away (for example, W, Mo, or the like). The thickness of the separation layer 1701 is desirably 50 to 60 nm.

Next, the base insulating film 1702 is formed over the separation layer 1701. The base insulating film 1702 is formed in order to prevent alkaline earth metal or alkali metal such as Na included in the first substrate from diffusing into the semiconductor film. Alkali metal or alkaline earth metal causes an adverse effect on characteristics of a semiconductor element such as a TFT if such metal is in the semiconductor film. The base insulating film 1702 also has a role to protect semiconductor elements in a later step of separating the semiconductor elements. The base insulating film 1702 may have a single-layer structure or a stacked structure. Therefore, the base insulating film 1702 is formed using an insulating film which can suppress the diffusion of alkali metal and alkaline earth metal in the semiconductor film, such as silicon oxide, silicon nitride, silicon oxide containing nitrogen, or silicon nitride containing oxygen.

Next, the semiconductor film 1703 is formed over the base insulating film 1702. The semiconductor film 1703 is preferably formed without exposing the substrate to the air after forming the base insulating film 1702. The thickness of the semiconductor film 1703 is set in the range of 20 to 200 nm (desirably 40 to 170 nm, more desirably 50 to 150 nm).

Subsequently, the marker formation film 1704 is formed by a photolithography method, whereby a marker used for alignment is formed. As the shape of the marker, in general, basic shapes such as a circle or a quadrilateral are frequently used. This is because an image can be accurately recognized when a side (an edge) of the marker is clear. It is to be noted that the number of the markers is not particularly limited, and any number of markers may be provided as long as a position of the laser irradiation can be fixed.

Further, the substrate with marker according to the present invention, which is manufactured through the steps, is placed over the θ-axis stage as shown in FIG. 8, and alignment of the substrate is performed with the use of a laser irradiation apparatus of the present invention. The number of the markers used for alignment is not particularly limited, and any number of markers may be provided as long as a position of the laser irradiation or a position of the light exposure can be fixed. In this embodiment mode, the substrate is disposed so that at least two markers of the markers used for alignment are parallel to a channel direction of a TFT. By detecting the two markers and by adjusting a rotation angle with the use of the θ-axis stage, the channel direction of the TFT and a scanning direction of the linear beam can be made parallel to each other. In this embodiment mode, the marker is formed of the opening in the marker formation film 1704 on a back surface of the substrate; however, the marker may be formed directly on the substrate 1700 by using laser ablation or the like. In that case, the marker may be formed on a front surface or a back surface of the substrate having an insulating surface, or may be formed inside the substrate.

Subsequently, the X-axis stage and the Y-axis stage are appropriately scanned from front to back and from side to side, whereby an entire surface of the substrate 1700 is irradiated with the linear beam and the semiconductor film 1703 is crystallized.

Figure 9A:
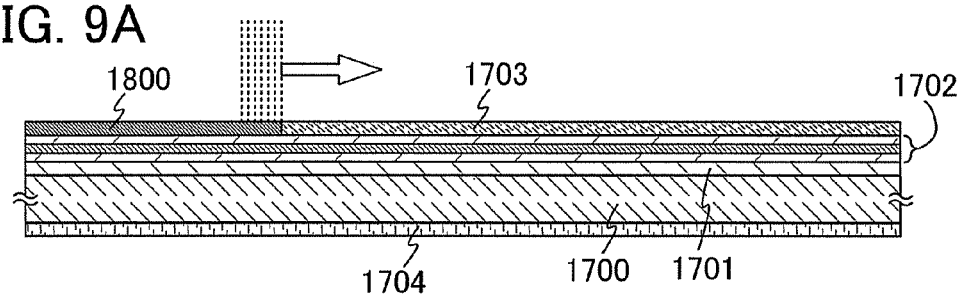
FIGS. 9A to 9E are views showing an outline of a manufacturing process of a semiconductor device using a light irradiation apparatus of the present invention.

Next, a manufacturing step of a thin film integrated circuit is described with reference to FIGS. 9A to 13B. FIG. 9A is a cross-sectional view taken along the dashed line connecting M and N in FIG. 8. As shown in FIG. 9A, the separation layer 1701, the base insulating film 1702, and the semiconductor film 1703 are sequentially stacked and formed over the substrate 1700 on the back surface of which the marker used for alignment is formed. Then, the semiconductor film 1703 is irradiated with a linear beam with the use of the laser irradiation apparatus of this embodiment mode, whereby a semiconductor film 1800 (a crystalline region) having a crystalline structure is formed (see FIG. 9A).

Figure 9B:
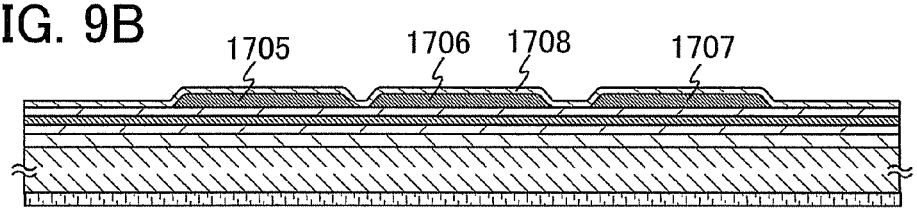

Next, as shown in FIG. 9B, a semiconductor film 1800 having a crystal structure is etched to form island-shaped semiconductor films 1705 to 1707, and then a gate insulating film 1708 is formed. The gate insulating film 1708 is formed using silicon nitride, silicon oxide, silicon oxide containing nitrogen, or silicon nitride containing oxygen in a single-layer structure or a stacked structure by a plasma CVD method, a sputtering method, or the like.

After forming the gate insulating film 1708, heat treatment at 300 to 450° C. for 1 to 12 hours may be performed in an atmosphere containing 3% or more of hydrogen to hydrogenate the island-shaped semiconductor films 1705 to 1707. As another method for the hydrogenation, plasma hydrogenation (using hydrogen excited in plasma) may be conducted.

Figure 9C:
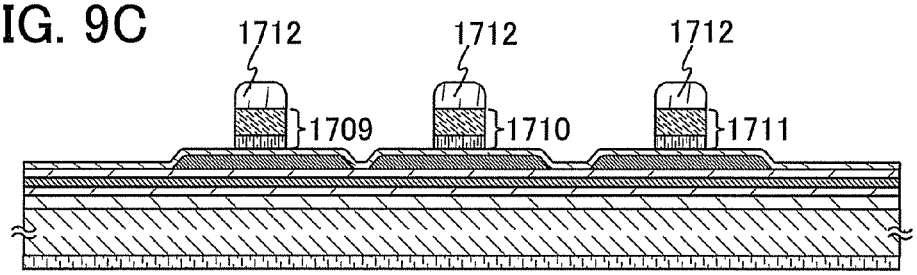

Next, as shown in FIG. 9C, gate electrodes 1709 to 1711 are formed. Here, after stacking Si and W by a sputtering method, etching is conducted by using a resist 1712 as a mask, thereby forming the gate electrodes 1709 to 1711. The conductive material, structure, and manufacturing method of the gate electrodes 1709 to 1711 are not limited to these, and can be selected appropriately. For example, a stacked structure including NiSi (nickel silicide) and Si doped with impurities imparting n-type conductivity (such as phosphorus or arsenic), or a stacked structure including tantalum nitride and tungsten may be used. Moreover, a single layer structure using various conductive materials may be employed. In the case of forming the gate electrode and the antenna at the same time, the material may be selected in consideration of their functions.

A mask of silicon oxide or the like may be used instead of a resist mask. In this case, a step of forming a mask with silicon oxide, silicon oxide containing nitrogen, or the like (this mask is referred to as a hard mask) by etching is added; however, since the decrease in film thickness of the mask by the etching is less than that of a resist, the gate electrodes 1709 to 1711 with desired widths can be formed. Moreover, the gate electrodes 1709 to 1711 may be formed selectively by a droplet discharging method instead of using the resist 1712.

Figure 9D:
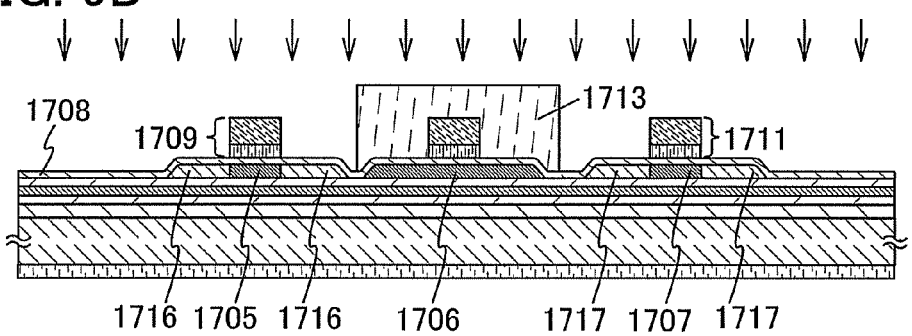

Next, as shown in FIG. 9D, the island-shaped semiconductor film 1706 to be a p-channel TFT is covered with a resist 1713, and the island-shaped semiconductor films 1705 and 1707 are doped with an impurity element imparting n-type conductivity (typified by P (phosphorus) or As (arsenic)) by using the gate electrodes 1709 and 1711 as masks. This doping step is conducted through the gate insulating film 1708 and a pair of low-concentration impurity regions 1716 and 1717 is formed in the island-shaped semiconductor films 1705 and 1707, respectively. This doping step may be conducted without covering the island-shaped semiconductor film 1706 to be a p-channel TFT with the resist 1713.

Figure 9E:
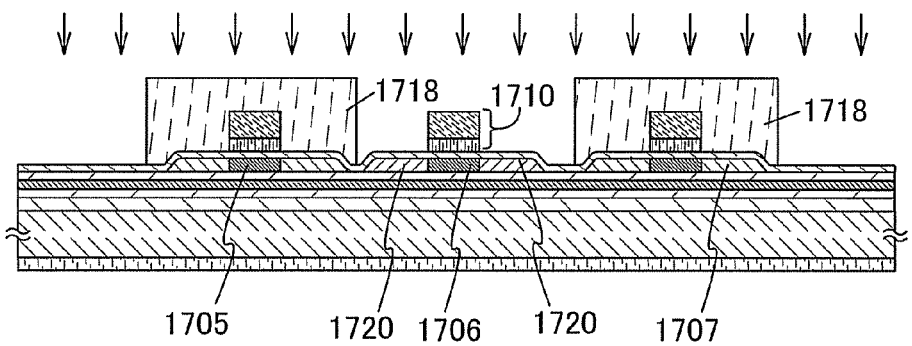

Next, as shown in FIG. 9E, after removing the resist 1713 by ashing or the like, resists 1718 are newly formed so as to cover the island-shaped semiconductor films 1705 and 1707 to be n-channel TFTs. By using the gate electrode 1710 as a mask, the island-shaped semiconductor film 1706 is doped with an impurity element imparting p-type conductivity (typically, B (boron)) so that a high-concentration impurity region is formed. This doping step is conducted through the gate insulating film 1708, thereby forming a pair of p-type high-concentration impurity regions 1720 in the island-shaped semiconductor film 1706.

Figure 10A:
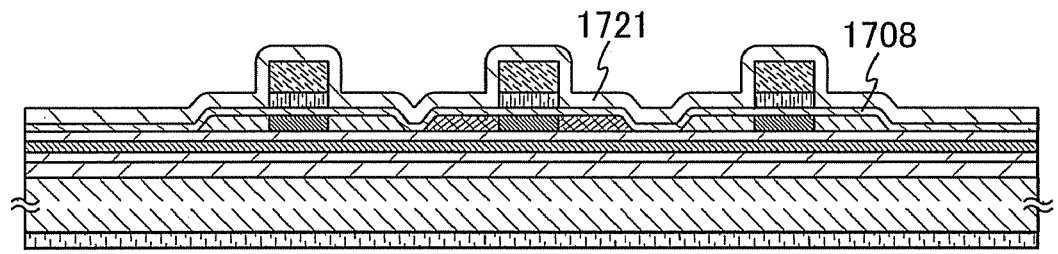
FIGS. 10A to 10C are views showing an outline of a manufacturing process of a semiconductor device using a light irradiation apparatus of the present invention.

Subsequently, as shown in FIG. 10A, after removing the resists 1718 by ashing or the like, an insulating film 1721 is formed so as to cover the gate insulating film 1708 and the gate electrodes 1709 to 1711.

Figure 10B:
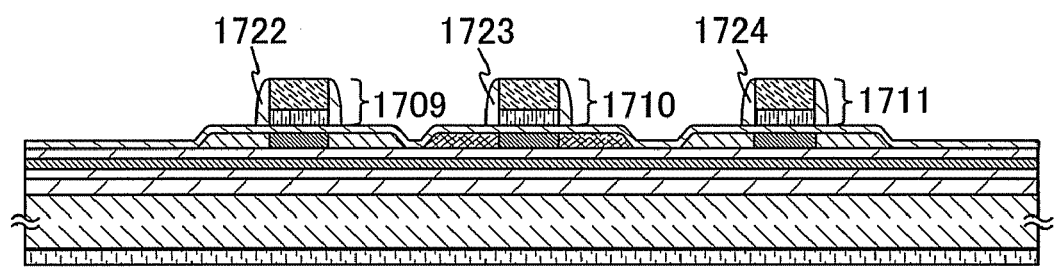

After that, the insulating film 1721 and the gate insulating film 1708 are partially etched by an etch-back method, whereby sidewalls 1722 to 1724 that are in contact with side walls of the gate electrodes 1709 to 1712 are formed in a self-aligning manner as shown in FIG. 10B. As the etching gas, a mixed gas of $CHF_3$ and He is used. It is to be noted that the step of forming the sidewalls is not limited to this condition.

Figure 10C:
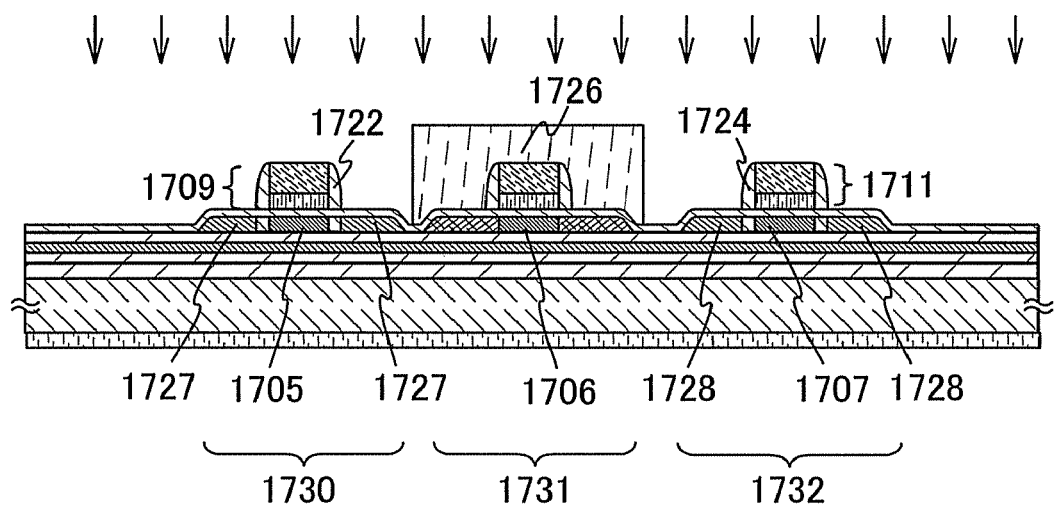

Next, as shown in FIG. 10C, a resist 1726 is newly formed so as to cover the island-shaped semiconductor film 1706 to be a p-channel TFT. By using the gate electrodes 1709 and 1711 and the sidewalls 1722 and 1724 as masks, an impurity element imparting n-type conductivity (typically, P or As) is added so that high-concentration impurity regions are formed. This doping step is conducted through the gate insulating film 1708, thereby forming a pair of n-type high-concentration impurity regions 1727 and 1728 in the island-shaped semiconductor films 1705 and 1707, respectively.

Next, after removing the resist 1726 by ashing or the like, the impurity regions may be thermally activated. For example, after forming a 50-nm-thick silicon oxide film containing nitrogen, heat treatment may be conducted at 550° C. for four hours under a nitrogen atmosphere. Moreover, after forming a 100-nm-thick silicon nitride film containing hydrogen, heat treatment may be conducted at 410° C. for one hour under a nitrogen atmosphere, whereby the defects in the polycrystalline semiconductor film can be reduced. This is, for example, to terminate dangling bonds in the polycrystalline semiconductor film and referred to as a hydrogenation treatment step or the like.

In accordance with a sequence of the above-described steps, an n-channel TFT 1730, a p-channel TFT 1731, and an n-channel TFT 1732 are formed. In the above manufacturing step, TFTs each having a LDD length of 0.2 to 2 µm can be formed by appropriately changing the condition of the etch-back method to adjust the size of the sidewall. Moreover, after that, a passivation film for protecting the TFTs 1730 to 1732 may be formed.

Figure 11A:
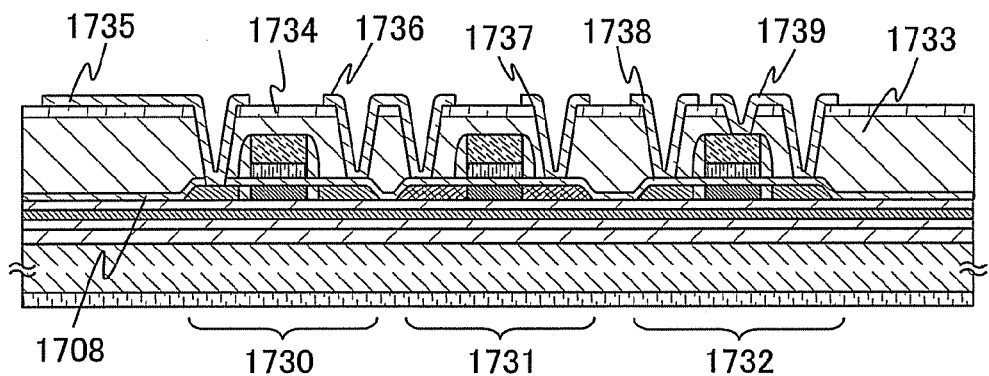
FIGS. 11A to 11C are views showing an outline of a manufacturing process of a semiconductor device using a light irradiation apparatus of the present invention.

Subsequently, as shown in FIG. 11A, a first interlayer insulating film 1733 is formed so as to cover the TFTs 1730 to 1732. Moreover, a second interlayer insulating film 1734 is formed over the first interlayer insulating film 1733. A filler may be mixed into the first interlayer insulating film 1733 or the second interlayer insulating film 1734 in order to prevent the first interlayer insulating film 1733 or the second interlayer insulating film 1734 from being peeled or cracked due to stress caused by a difference of a coefficient of thermal expansion between the first interlayer insulating film 1733 or the second interlayer insulating film 1734 and a conductive material and the like for forming a wiring later.

Next, contact holes are formed in the first interlayer insulating film 1733, the second interlayer insulating film 1734, and the gate insulating film 1708, and wirings 1735 to 1739 to be connected to the TFTs 1730 to 1732 are formed. The wirings 1735 and 1736 are connected to the high-concentration impurity regions 1727 of the n-channel TFT 1730, the wirings 1736 and 1737 are connected to the high-concentration impurity regions 1720 of the p-channel TFT 1731, and the wirings 1738 and 1739 are connected to the high-concentration impurity regions 1728 of the n-channel TFT 1732, respectively. The wiring 1739 is also connected to the gate electrode 1711 of the n-channel TFT 1732. The n-channel TFT 1732 can be used as a memory element of a random ROM.

Figure 11B:
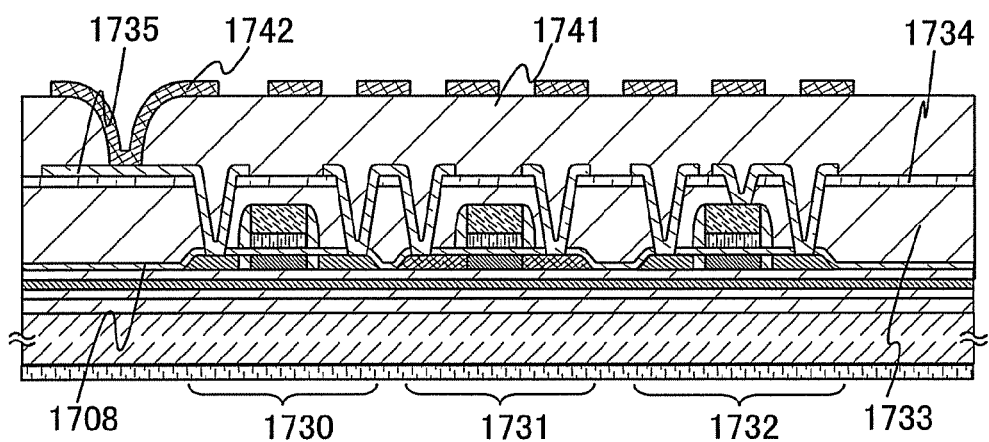
Figure 11C:
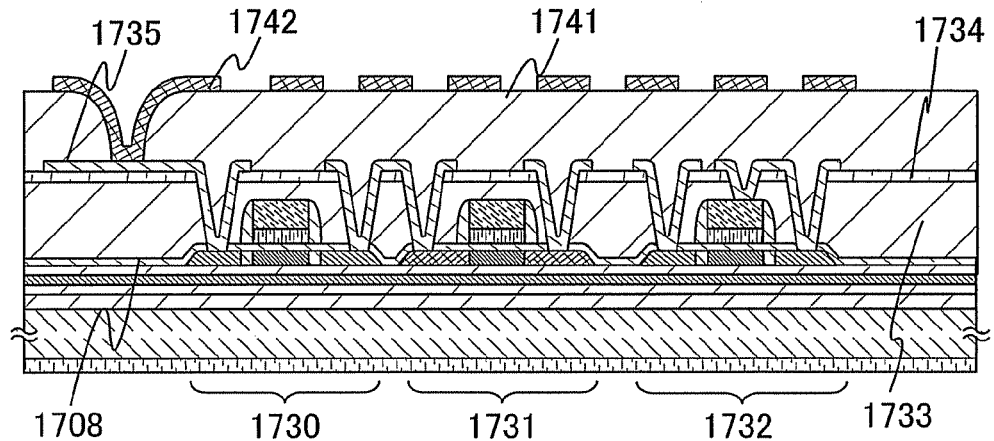

Next, as shown in FIG. 11B, a third interlayer insulating film 1741 is formed over the second interlayer insulating film 1734 so as to cover the wirings 1735 to 1739. The third interlayer insulating film 1741 is formed so as to have an opening portion at a position where the wiring 1735 is partially exposed. The third interlayer insulating film 1741 can be formed using the similar material to the first interlayer insulating film 1733.

Next, an antenna 1742 is formed over the third interlayer insulating film 1741. The antenna 1742 can be formed using a conductive material including one or more of the following metal or one or more of metal compounds containing the following metal: Ag, Au, Cu, Pd, Cr, Mo, Ti, Ta, W, Al, Fe, Co, Zn, Sn, Ni, or the like. The antenna 1742 is connected to the wiring 1735. In FIG. 11B, the antenna 1742 is directly connected to the wiring 1735; however, the wireless IC tag of the present invention is not limited to this structure. For example, by using a separately-formed wiring, the antenna 1742 may be electrically connected to the wiring 1735.

The antenna 1742 can be formed by a photolithography method, an evaporation method, a droplet discharging method, or the like. In FIG. 11B, the antenna 1742 is formed using a single conductive film; however, the antenna 1742 can be formed by stacking a plurality of conductive films. For example, the antenna 1742 may be formed by coating a Ni wiring or the like with Cu by electroless plating. The droplet discharging method is a method in which a predetermined pattern is formed by discharging a droplet containing a predetermined composition from a small nozzle, and includes an ink-jet method and the like in its category. The printing method includes a screen printing method, an off-set printing method, and the like. By using a printing method or a droplet discharging method, the antenna 1742 can be formed without using a mask for light-exposure. Moreover, a droplet discharging method and a printing method does not waste materials which are to be etched away in a photolithography method. Since an expensive mask for light-exposure is not necessary, the cost spent on the manufacturing of wireless IC tags can be suppressed.

In the case of using a droplet discharging method or various printing methods, for example, a conductive particle like Cu coated with Ag can also be used. If the antenna 1742 is formed by a droplet discharging method, it is desirable to perform a treatment for enhancing the adhesiveness of the antenna 1742 to the surface of the third interlayer insulating film 1741. As a method for enhancing the adhesiveness, specifically, a method in which metal or a metal compound which can enhance the adhesiveness of a conductive film or an insulating film by a catalytic action is attached to the surface of the third interlayer insulating film 1741, a method in which an organic insulating film, metal, or a metal compound which has high adhesiveness with respect to a conductive film or an insulating film to be formed is attached to the surface of the third interlayer insulating film 1741, a method in which surface modification is carried out through a plasma treatment to the surface of the third interlayer insulating film 1741 under atmospheric pressure or low pressure can be given.

If the metal or the metal compound to be attached to the third interlayer insulating film 1741 has a conductive property, sheet resistance thereof is controlled so that normal operation of the antenna is not interrupted. Specifically, the average thickness of the metal or the metal compound having a conductive property may be controlled so as to range from, for example, 1 to 10 nm, or the metal or the metal compound may be insulated wholly or partially by oxidation. Alternatively, the attached metal or metal compound may be selectively etched away except for a region where the adhesiveness is to be increased. Moreover, the metal or the metal compound may be selectively attached to only a particular region by a droplet discharging method, a printing method, a sol-gel method, or the like instead of attaching the metal or the metal compound in advance to the whole surface of the substrate.

The metal or the metal compound is not necessary to have a completely continuous film shape, and may be dispersed to some extent.

Figure 12A:
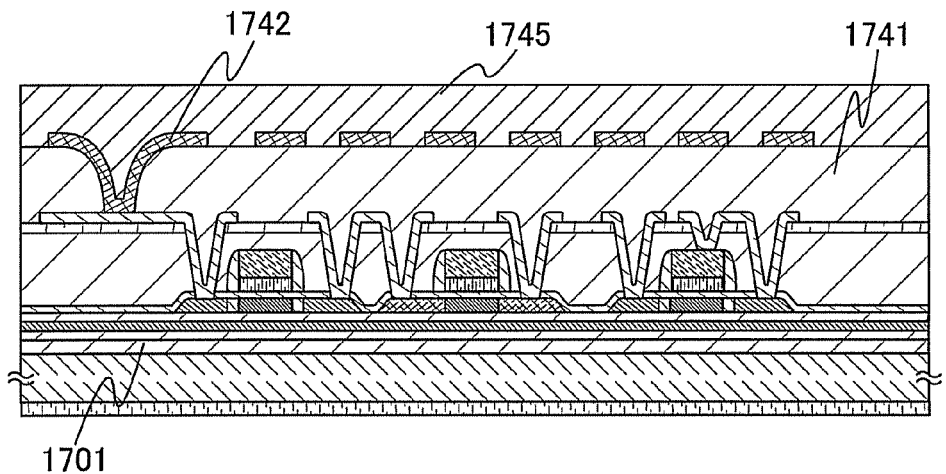
FIGS. 12A to 12C are views showing an outline of a manufacturing process of a semiconductor device using a light irradiation apparatus of the present invention.

Then, as shown in FIG. 12A, after forming the antenna 1742, a protective layer 1745 is formed over the third interlayer insulating film 1741 so as to cover the antenna 1742. The protective layer 1745 is formed using a material which can protect the antenna 1742 when the separation layer 1701 is etched away later. For example, the protective layer 1745 can be formed by applying a resin of a silicon type, an acrylate type, or an epoxy type which can be dissolved in water or alcohols.

Figure 12B:
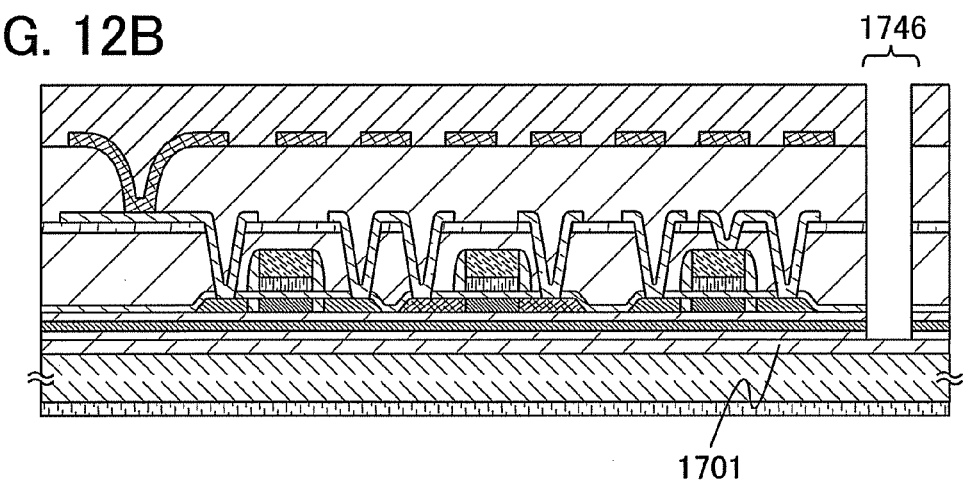

Subsequently, as shown in FIG. 12B, a groove 1746 is formed so as to separate the respective wireless IC tags. The groove 1746 may have the depth such that the separation layer 1701 is exposed. The groove 1746 can be formed by dicing, scribing, or the like. If it is not necessary to separate the wireless IC tags formed over the first substrate 1700, the groove 1746 is not necessary to be formed.

Figure 12C:
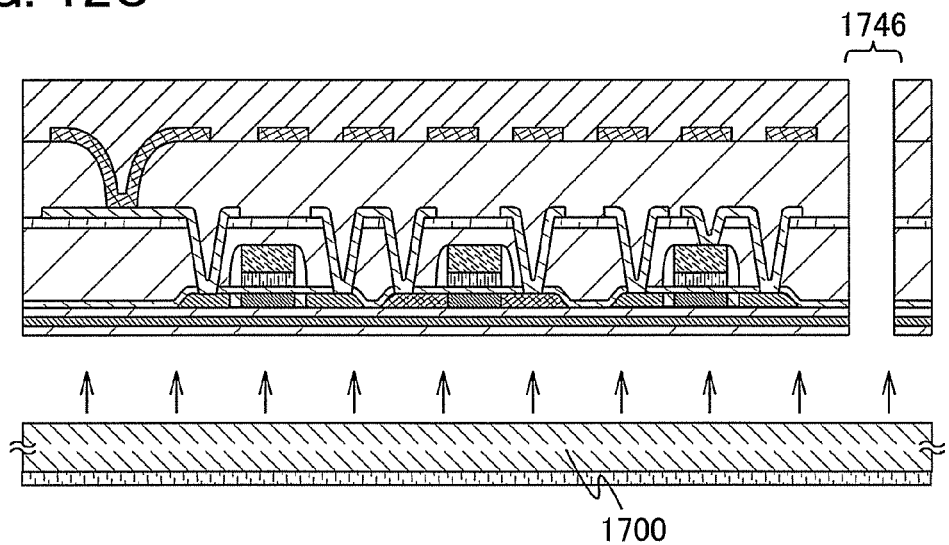

Next, as shown in FIG. 12C, the separation layer 1701 is etched away. Here, halogen fluoride is used as the etching gas, and this gas is introduced from the groove 1746. For example, $ClF_3$ (chlorine trifluoride) is used, and the etching is conducted at 350° C. with a flow rate of 300 sccm under a pressure of 798 Pa for three hours. Nitrogen may be mixed into the $ClF_3$ gas. By using halogen fluoride gas such as $ClF_3$, the separation layer 1701 can be selectively etched, whereby the first substrate 1700 can be separated from the TFTs 1730 and 1732. The halogen fluoride may be either gas or liquid.

Figure 13A:
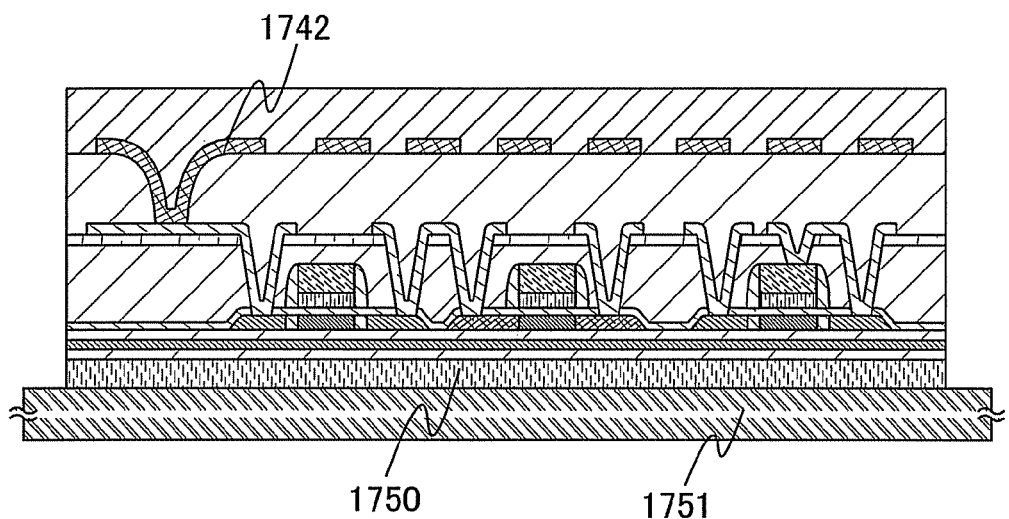
FIGS. 13A and 13B are views showing an outline of a manufacturing process of a semiconductor device using a light irradiation apparatus of the present invention.

Subsequently, as shown in FIG. 13A, the separated TFTs 1730 to 1732 and the antenna 1742 are pasted to a second substrate 1751 by using an adhesive 1750. The adhesive 1750 is formed using a material that can paste the second substrate 1751 with the base insulating film 1702. As the adhesive 1750, for example, a reactive curable adhesive, a thermosetting adhesive, a photo curable adhesive such as a UV curable adhesive, an anaerobic adhesive, or the like can be used.

The second substrate 1751 can be formed using an organic material such as flexible paper or plastic.

Figure 13B:
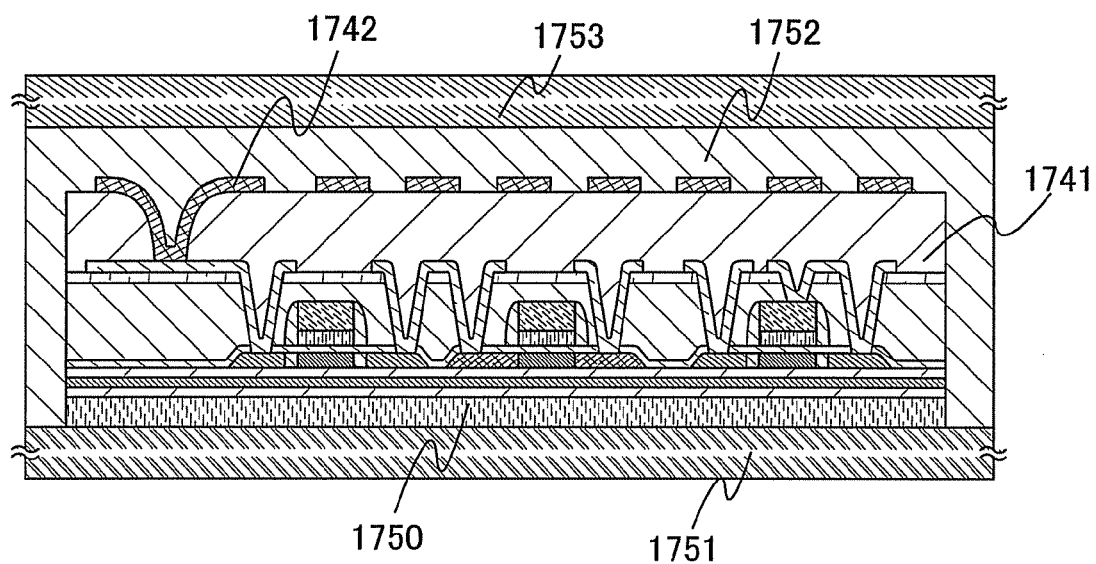

Next, as shown in FIG. 13B, after removing the protective layer 1745, an adhesive 1752 is applied onto the third interlayer insulating film 1741 so as to cover the antenna 1742, and a cover material 1753 is pasted. The cover material 1753 can be formed using an organic material such as flexible paper or plastic, similarly to the second substrate 1751. The thickness of the adhesive 1752 may range from, for example, 10 to 200 µm.

The adhesive 1752 is formed using a material that can paste the cover material 1753 with the third interlayer insulating film 1741 and the antenna 1742. As the adhesive 1752, for example, a reactive curable adhesive, a thermosetting adhesive, a photo curable adhesive such as a UV curable adhesive, an anaerobic adhesive, or the like can be used.

Through the above-described steps, the wireless IC tag is completed. In accordance with the above manufacturing method, an extremely thin integrated circuit with a thickness of greater than or equal to 0.3 µm and less than or equal to 3 µm, typically about 2 µm, can be formed between the second substrate 1751 and the cover material 1753.

Further, in a light exposure step of a photolithography method in the steps of a manufacturing method of a wireless IC tag described in the above, a position of light irradiation may be adjusted with the use of a light exposure apparatus of the present invention, which is shown in FIG. 4. By using the light exposure apparatus according to the present invention, a photoresist formed over the substrate can be exposed to light with high precision.

The thickness of the integrated circuit includes not only the thickness of the semiconductor element itself but also the thicknesses of the various insulating films and interlayer insulating films formed between the adhesive 1750 and the adhesive 1752. Moreover, the area of the integrated circuit in the wireless IC tag can be made 5 mm or less on each side (25 mm$^2$ or less), more desirably about 0.3 mm on each side (0.09 mm$^2$) to 4 mm on each side (16 mm$^2$).

Although this embodiment mode shows the method for separating the substrate and the integrated circuit by etching away the separation layer provided between the integrated circuit and the first substrate 1700 having high heat resistance, the method of manufacturing a wireless IC tag of the present invention is not limited to this. For example, a metal oxide film may be provided between the integrated circuit and the substrate having high heat resistance and this metal oxide film may be weakened by crystallization, so that the integrated circuit is separated. Alternatively, a separation layer using an amorphous semiconductor film containing hydrogen is provided between the integrated circuit and the substrate having high heat resistance and this separation layer is removed by irradiation with a laser beam, so that the substrate and the integrated circuit are separated from each other. Moreover, the integrated circuit may be separated from the substrate by mechanically removing or etching away with the use of solution or gas from the substrate having high heat resistance with the integrated circuit formed.

Although this embodiment mode shows the example of forming the antenna and the integrated circuit over one substrate, the present invention is not limited to this structure. The antenna and the integrated circuit may be formed over different substrates and may be electrically connected by being pasted to each other later.

Usually, RFID (radio frequency identification) often uses an electric wave frequency of 13.56 MHz or 2.45 GHz. Considering the enhancement of versatility, it is very important to form wireless IC tags so as to detect electric waves with these frequencies.

The wireless IC tag of this embodiment mode has advantages that an electric wave is difficult to be blocked as compared with an RFID tag formed using a semiconductor substrate and attenuation of signals due to the block of the electric wave can be prevented. Therefore, since semiconductor substrates are not necessary to be used, the manufacturing cost of the wireless IC tag can be drastically decreased.

Although this embodiment mode has shown the example of separating the integrated circuit and pasting the integrated circuit to the flexible substrate, the present invention is not limited to this structure. For example, in the case of using a substrate having high temperature which can withstand the heat treatment in the manufacturing steps of the integrated circuit in an IC tag, such as a glass substrate, it is not always necessary to separate the integrated circuit.

In this embodiment mode, the marker used for alignment provided for the substrate is detected using a camera or the like which detects a position and senses infrared light, and alignment of the substrate is performed. Accordingly, the semiconductor film can be irradiated with the laser beam with high precision. Further, since a desired position over the substrate can be irradiated with a light beam from the light source, the desired position can be patterned accurately. Since the marker is not formed over the semiconductor film, flexibility in designing a circuit can be improved. There is no fear of contaminating the substrate by scattering the base film in laser irradiation. Furthermore, since a desired position of the semiconductor film can be irradiated with a laser beam accurately, laser annealing can be performed on the desired position uniformly. Accordingly, a TFT with a good characteristic can be manufactured efficiently.

Embodiment Mode 6

According to the present invention, a desired position over the substrate can be irradiated with a light beam from a light source precisely, and thus, the desired position can be uniformly annealed or patterned accurately. Therefore, the productivity and degree of integration of semiconductor devices can be increased. By using the semiconductor device of the present invention, electronic appliances can be manufactured with high throughput and favorable quality. Specific examples are described with reference to FIGS. 14A to 15B. It is to be noted that the present invention can be implemented in various different modes, and it will be readily apparent to those skilled in the art that various changes and modifications in modes and details thereof can be made without departing from the purpose and scope of the present invention. Therefore, the present invention should not be interpreted as being limited to the description of this embodiment mode.

Figure 14A:
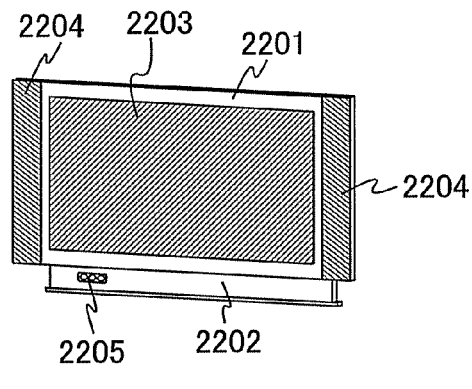
FIGS. 14A to 14F are views each showing an outline of an electronic device using a semiconductor device of the present invention.

FIG. 14A shows a display device including a case 2201, a supporter 2202, a display portion 2203, a speaker portion 2204, a video input terminal 2205, and the like. Pixels in the display portion 2203 include thin film transistors which are manufactured by the similar method to Embodiment Mode 3. This makes it possible to enlarge the area of a crystal region without causing stripes due to laser diffraction to appear on a semiconductor film, to decrease the area of an inferior crystallinity region, and to increase the productivity of the display device. Moreover, since a laser irradiation process of a large substrate can be carried out efficiently by the present invention, the productivity of the display device can be increased. Therefore, the manufacturing cost of a large-screen display device can be decreased. Further, the display device may have a memory, a driver circuit portion, and the like, and the semiconductor device manufactured by applying the present invention may be applied to the memory, the driver circuit portion, and the like. The display device includes various display devices in which thin film transistors and various display media are combined, such as a liquid crystal display device using an electro-optic effect of a liquid crystal, a display device using a luminescent material such as electroluminescence, a display device using an electron source element, or a display device using a contrast medium (also referred to as electronic ink) whose reflectivity depends on the application of an electric field. The display device can be used for all kinds of information display appliances, such as computers, televisions, information display appliances like electronic books, advertisement display, or information display.

Figure 14B:
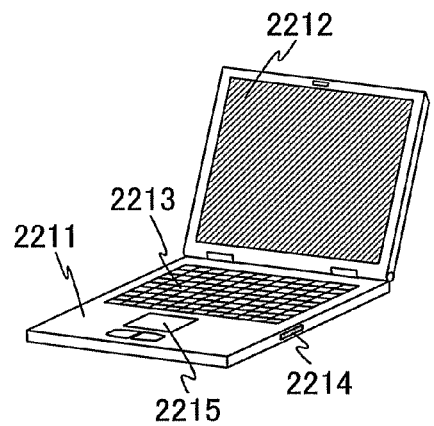

FIG. 14B shows a computer including a case 2211, a display portion 2212, a keyboard 2213, an external connection port 2214, a pointing device 2215, and the like. Thin film transistors are used in the display portion 2212 and a CPU, a memory, a driver circuit portion, and the like attached to the computer. By using the thin film transistors manufactured with the use of the laser irradiation apparatus of the present invention for the display portion 2212 and the CPU, the memory, the driver circuit portion, and the like attached to the computer, the product quality can be improved and the variation in the product quality can be decreased.

Figure 14C:
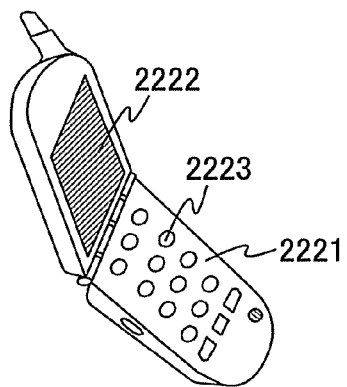

FIG. 14C shows a mobile phone as a typical example of mobile terminals. This mobile phone includes a case 2221, a display portion 2222, an operation key 2223, and the like. Thin film transistors are used in the display portion 2222, a CPU attached to the mobile phone, a functional circuit such as a memory, and the like. By using the thin film transistors manufactured with the use of the laser irradiation apparatus of the present invention for the display portion 2222, the CPU attached to the mobile phone, and the functional circuit such as the memory, the product quality can be improved and the variation in the product quality can be decreased. The semiconductor devices manufactured with the use of the laser irradiation apparatus of the present invention can be used in electronic appliances such as a PDA (personal digital assistant), a digital camera, and a compact game machine, in addition to the mobile phone.

Figure 14D:
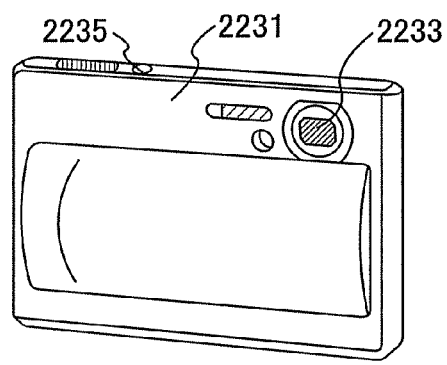
Figure 14E:
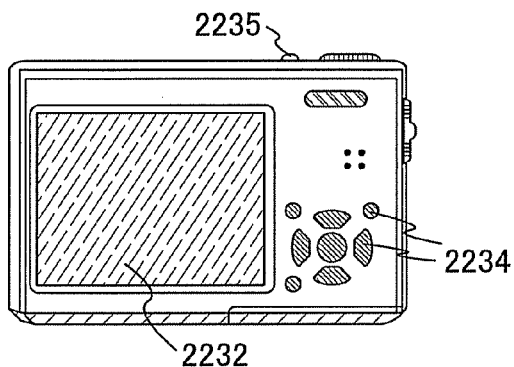

FIGS. 14D and 14E show a digital camera. FIG. 14E shows a rear side of the digital camera shown in FIG. 14D. This digital camera includes a case 2231, a display portion 2232, a lens 2233, operation keys 2234, a shutter 2235, and the like. Thin film transistors are used in the display portion 2232, a driver circuit portion for controlling the display portion 2232, and the like. By using the thin film transistors manufactured with the use of the laser irradiation apparatus of the present invention for the display portion 2232, the driver circuit portion for controlling the display portion 2232, and other circuits, the product quality can be improved and the variation in the product quality can be decreased.

Figure 14F:
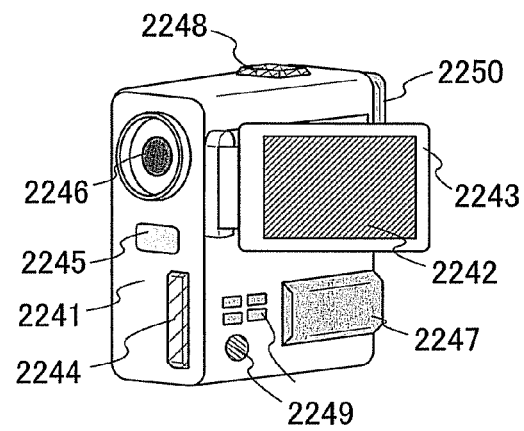

FIG. 14F shows a digital video camera including a main body 2241, a display portion 2242, a case 2243, an external connection port 2244, a remote control receiving portion 2245, an image receiving portion 2246, a battery 2247, an audio input portion 2248, operation keys 2249, an eyepiece portion 2250, and the like. Thin film transistors are used in the display portion 2242 and a driver circuit portion for controlling the display portion 2242. By using the thin film transistors manufactured with the use of the laser irradiation apparatus of the present invention for the display portion 2242, the driver circuit portion for controlling the display portion 2242, and other circuits, the product quality can be improved and the variation in the product quality can be decreased.

Moreover, the thin film transistors manufactured with the use of the laser process apparatus of the present invention can be used for a thin film integrated circuit or a non-contact type thin film integrated circuit device (also referred to as a wireless IC tag or an RFID (radio frequency identification)). A thin film integrated circuit and a non-contact type thin film integrated circuit manufactured using the manufacturing method shown in other embodiment modes can be used for a tag or a memory.

Figure 15A:
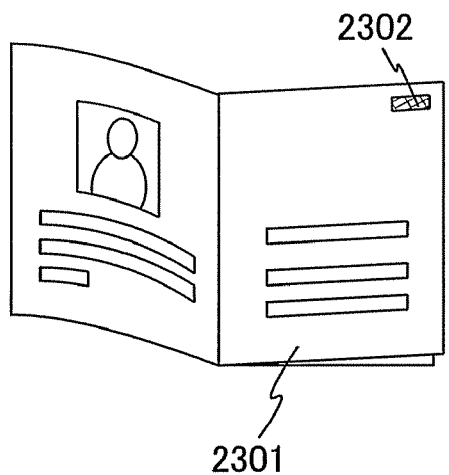
FIGS. 15A and 15B are views each showing an outline of an article using a semiconductor device of the present invention.

FIG. 15A shows a passport 2301 with a wireless IC tag 2302 pasted thereto. Alternatively, the wireless IC tag 2302 may be embedded in the passport 2301. Similarly, the wireless IC tag can be attached or embedded in a driver's license, a credit card, a banknote, a coin, a certificate, a merchandise coupon, a ticket, a traveler's check (T/C), a health insurance card, a resident card, a family register, and the like. In this case, only the information saying this is the real one is input in the wireless IC tag and an access authority is set so that the information cannot be read and written illegally. By using the tag in this way, it is possible to distinguish the forged one and the real one.

Figure 15B:
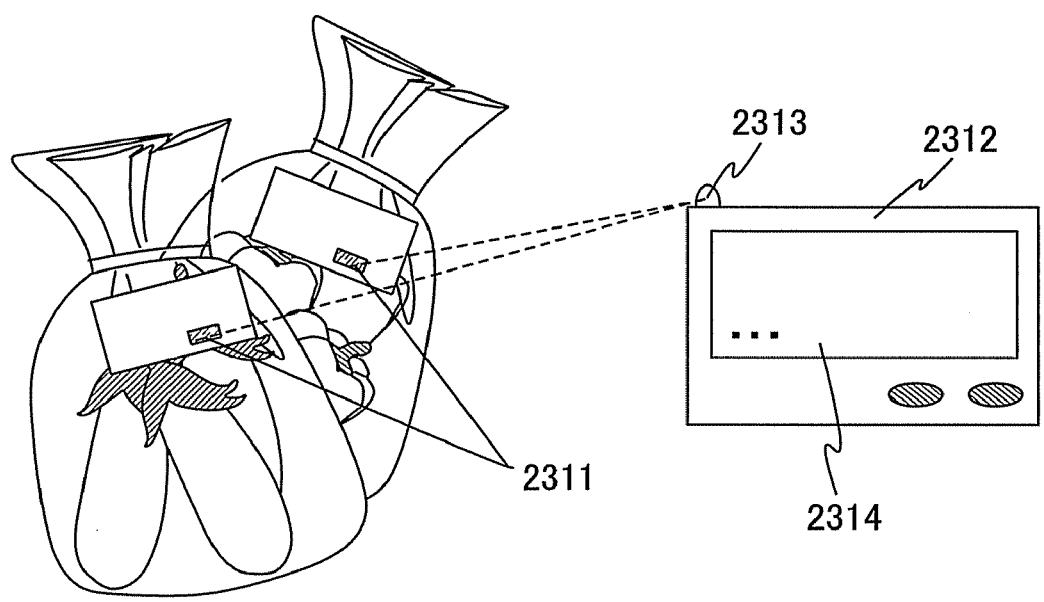

Besides, the wireless IC tag can be used as a memory. FIG. 15B shows an example of embedding a wireless IC tag 2311 in a label to be pasted to a package of vegetables. Alternatively, the wireless IC tag may be attached directly to the package or embedded in the package. In the wireless IC tag 2311, a production area, a producer, a manufacturing date, and a process at a production stage such as a process method, a distribution process of the product, a price, quantity, an intended purpose, a shape, weight, an expiration date, various kinds of authentication information, and the like can be recorded. Information from the wireless IC tag 2311 is received by an antenna portion 2313 of a wireless reader 2312 and read thereby, and displayed on a display portion 2314 of the reader 2312. Thus, wholesalers, retailers, and consumers can know the information easily. Moreover, access authority can be set for each of producers, traders, and consumers. Those who do not have the access authority cannot read, write, rewrite, and erase the data in the wireless IC tag.

The wireless IC tag can be used in the following way. At the payment, the information that the payment has been made is written in the wireless IC tag, and the wireless IC tag is checked by a checking device provided at an exit whether or not the information that the payment has been made is written in the wireless IC tag. If the IC tag is brought out from the store without making the payment, the alarm rings. With this method, forgetting of the payment and shoplifting can be prevented.

In consideration of protecting customer's privacy, the following method is also possible. At the payment at a cash register, any of the followings is conducted; (1) data input in the wireless IC tag are locked by pin numbers or the like, (2) data itself input in the wireless IC tag are encrypted, (3) data input in the wireless IC tag are erased, and (4) data input in the wireless IC tag are destroyed. Then, a checking device is provided at an exit, and whether any one of processes (1) to (4) has been conducted or whether the data in the wireless IC tag are not processed is checked so that whether the payment has been made or not is checked. In this way, whether the payment has been made or not can be checked in the store, and reading out the information in the wireless IC tag against the owner's will outside the store can be prevented.

Several methods are given to destroy the data input in the wireless IC tag in (4). For example, (a) only data are destroyed by writing one or both of "0 (off)" and "1 (on)" in at least a part of electronic data in the wireless IC tag, or (b) current is fed excessively in the wireless IC tag to physically destroy a part of a wiring in a semiconductor element in the wireless IC tag.

Since the manufacturing cost of these wireless tags mentioned above is higher than that of conventionally used barcodes, the cost reduction is necessary. According to the present invention, however, since uniform laser annealing of a semiconductor film is possible, semiconductor devices with favorable product quality and no variation can be effectively manufactured, which is effective in the cost reduction. Furthermore, by using the present invention, the wireless tags can be manufactured so that any wireless tag has high product quality and no variation of performance.

As thus described, the semiconductor device manufactured by the present invention can be applied in a wide range, and the semiconductor device manufactured by the present invention can be applied to electronic appliances of every field.

This application is based on Japanese Patent Application serial No. 2006-317496 filed with Japan Patent Office on Nov. 24, 2006, the entire contents of which are hereby incorporated by reference.

What is claimed is:

1. A manufacturing method of a semiconductor device comprising the steps of:
  forming a film having a marker over one surface of a substrate;
  mounting the substrate on a stage including an opening so that a surface of the film contacts with the stage, and the marker overlaps with the opening;
  detecting the marker using a camera which senses infrared light;
  controlling a position of the stage;

emitting a laser beam from a laser oscillator;
processing the laser beam emitted from the laser oscillator into a linear shape by an optical system; and
crystallizing a semiconductor film formed over the other surface of the substrate by irradiating with the laser beam processed into the linear shape,
wherein the substrate transmits infrared light, and
wherein the film does not transmit infrared light.

2. The manufacturing method of a semiconductor device according to claim 1, wherein the substrate is fixed by a suction hole of the stage.

3. The manufacturing method of a semiconductor device according to claim 1, wherein the substrate includes at least two markers, and wherein a position of the stage is controlled so that a line segment connecting the two markers and a scanning direction of the laser beam are parallel to each other.

4. The manufacturing method of a semiconductor device according to claim 1, wherein a scanning direction of the laser beam is parallel to a direction of carrier transfer in a channel region of a transistor in which the semiconductor film is used as a channel region.

5. The manufacturing method of a semiconductor device according to claim 1, wherein the infrared light has a wavelength between 800 nm to 1500 nm.

6. A manufacturing method of a semiconductor device comprising the steps of:
    forming a film having a marker over one surface of a substrate;
    mounting the substrate on a stage so that a surface of the film over which the marker is provided contacts with the stage;
    detecting the marker formed over the surface of the film using a camera which senses infrared light;
    controlling a position of the stage;
    emitting a laser beam from a laser oscillator;
    processing the laser beam emitted from the laser oscillator into a linear shape by an optical system; and
    crystallizing a semiconductor film formed over the other surface of the substrate by irradiating with the laser beam processed into the linear shape,
    wherein the substrate transmits infrared light, and
    wherein the film does not transmit infrared light.

7. The manufacturing method of a semiconductor device according to claim 6, wherein the substrate is fixed by a suction hole of the stage.

8. The manufacturing method of a semiconductor device according to claim 6, wherein the substrate includes at least two markers, and wherein a position of the stage is controlled so that a line segment connecting the two markers and a scanning direction of the laser beam are parallel to each other.

9. The manufacturing method of a semiconductor device according to claim 6, wherein a scanning direction of the laser beam is parallel to a direction of carrier transfer in a channel region of a transistor in which the semiconductor film is used as a channel region.

10. The manufacturing method of a semiconductor device according to claim 1, wherein the infrared light has a wavelength between 800 nm to 1500 nm.

* * * * *

UNITED STATES PATENT AND TRADEMARK OFFICE
CERTIFICATE OF CORRECTION

| | | |
|---|---|---|
| PATENT NO. | : 8,138,058 B2 | Page 1 of 1 |
| APPLICATION NO. | : 11/942133 | |
| DATED | : March 20, 2012 | |
| INVENTOR(S) | : Koichiro Tanaka et al. | |

It is certified that error appears in the above-identified patent and that said Letters Patent is hereby corrected as shown below:

In the Claims:

Column 30, Line 26, Claim 10: Change "claim 1" to --claim 6--.

Signed and Sealed this
Ninth Day of October, 2012

David J. Kappos
*Director of the United States Patent and Trademark Office*